(12) United States Patent
Nilssen

(10) Patent No.: US 6,459,213 B1
(45) Date of Patent: Oct. 1, 2002

(54) BALLAST FOR PARALLEL-CONNECTED LAMPS

(76) Inventor: Ole K. Nilssen, Caesar Dr., Barrington, IL (US) 60010

(*) Notice: Subject to any disclaimer, the term of this patent is extended or adjusted under 35 U.S.C. 154(b) by 0 days.

(21) Appl. No.: 07/864,044

(22) Filed: Apr. 6, 1992

Related U.S. Application Data

(63) Continuation-in-part of application No. 07/734,188, filed on Jul. 22, 1991, now Pat. No. 5,428,266, which is a continuation-in-part of application No. 07/643,023, filed on Jan. 18, 1991, now abandoned, which is a continuation-in-part of application No. 06/787,692, filed on Oct. 15, 1985, now abandoned, which is a continuation of application No. 06/644,155, filed on Aug. 27, 1984, now abandoned, which is a continuation of application No. 06/555,426, filed on Nov. 23, 1983, now abandoned, which is a continuation of application No. 06/178,107, filed on Aug. 14, 1980, now abandoned, which is a continuation-in-part of application No. 05/973,741, filed on Dec. 28, 1978, now abandoned, which is a continuation-in-part of application No. 05/890,586, filed on Mar. 20, 1978, now Pat. No. 4,184,128, application No. 07/864,044, which is a continuation-in-part of application No. 07/820,918, filed on Jan. 15, 1992, now abandoned, which is a continuation-in-part of application No. 07/281,275, filed on Dec. 8, 1988, now abandoned, which is a continuation-in-part of application No. 07/080,865, filed on Aug. 3, 1987, now Pat. No. 4,819,146.

(51) Int. Cl.$^7$ .................. H05B 41/29; H05B 37/02
(52) U.S. Cl. .................. 315/224; 315/209 R; 315/219; 315/DIG. 4
(58) Field of Search .................. 315/224, 209 R, 315/219, 220, 240, DIG. 4, DIG. 5, DIG. 7, 307, 276; 331/113 A

(56) References Cited

U.S. PATENT DOCUMENTS

| | | | | |
|---|---|---|---|---|
| 3,026,486 A | * | 3/1962 | Pintell | 331/117 |
| 4,071,812 A | * | 1/1978 | Walker | 363/80 |
| 4,109,307 A | * | 8/1978 | Knoll | |
| 4,184,128 A | * | 1/1980 | Nilssen | |
| 4,266,134 A | * | 5/1981 | Frank et al. | 250/409 |
| 4,277,728 A | * | 7/1981 | Stevens | |
| 4,307,353 A | * | 12/1981 | Nilssen | |
| 4,414,493 A | * | 11/1983 | Henrich | |
| 4,513,364 A | * | 4/1985 | Nilssen | |
| 4,677,345 A | * | 6/1987 | Nilssen | |
| 4,712,170 A | * | 12/1987 | Grace | |
| 4,723,098 A | * | 2/1988 | Grubbs | |
| 4,857,806 A | * | 8/1989 | Nilssen | |
| 5,047,690 A | * | 9/1991 | Nilssen | |
| 5,191,262 A | * | 3/1993 | Nilssen | |

OTHER PUBLICATIONS

Bedford et al, Principles of Inverter Circuits, John Wiley & Sons, Inc, 1964 pp. 287–300.*

* cited by examiner

Primary Examiner—Ali Neyzari

(57) ABSTRACT

In an electronic ballast, a half-bridge inverter is powered from a DC voltage and provides a 40 kHz squarewave inverter output voltage. The DC voltage is obtained via a pre-converter with a control input operative to permit control of the magnitude of the DC voltage. The 40 kHz squarewave inverter output voltage is applied across a series-resonant L-C circuit, thereby establishing a 40 kHz sinusoidal voltage across the L-C circuit's tank capacitor. By controlling the symmetry of the squarewave voltage, the magnitude of the 40 kHz sinusoidal voltage is regulated to be appropriate to instant-starting a gas discharge lamp. Each of several instant-start fluorescent lamps is series-connected with a capacitor, such as to form several lamp-capacitor series-combinations, each of which is connected across the tank capacitor, thereby to be properly ignited and powered from the magnitude-controlled 40 kHz sinusoidal voltage. To attain imroved efficiency of operation, after the lamps have all ignited, the magnitude of the 40 kHz sinusoidal voltage is reduced, thereby minimizing the amount of reactive power having to be handled by the various reactive circuit components.

32 Claims, 13 Drawing Sheets

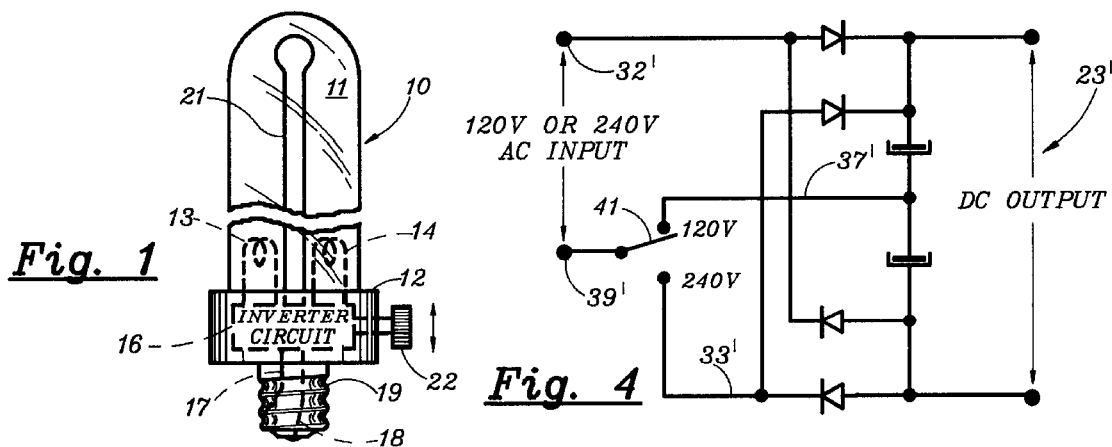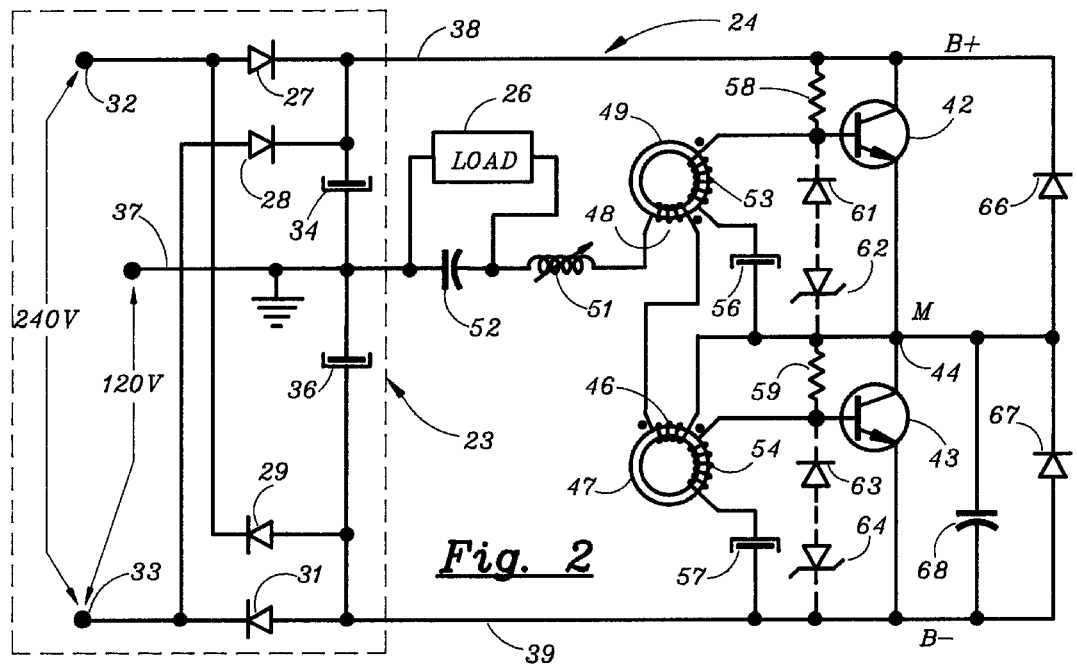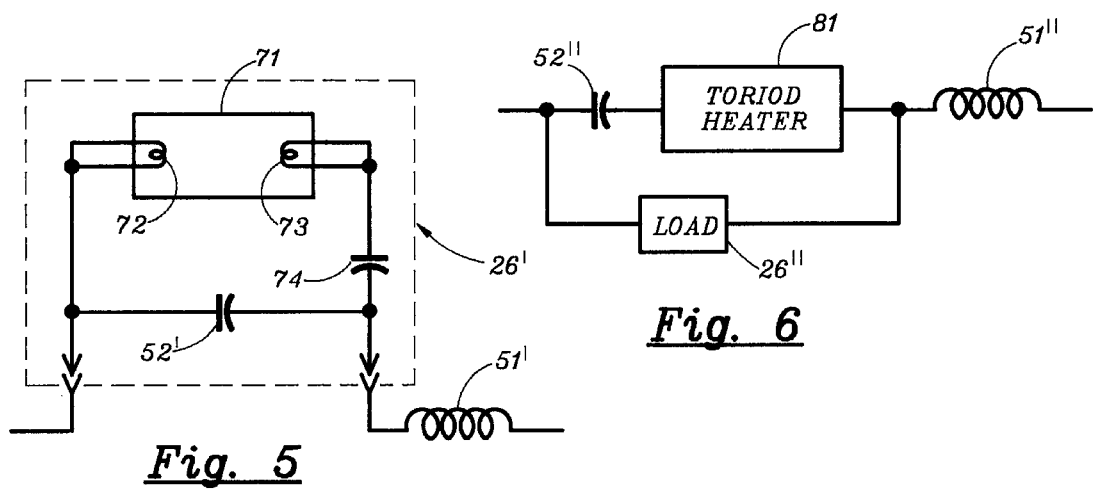

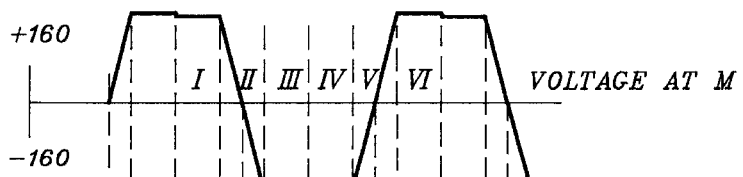
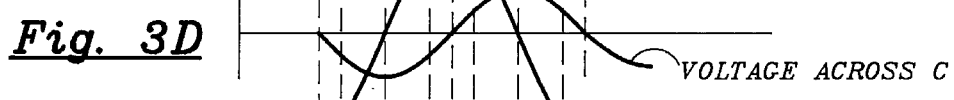
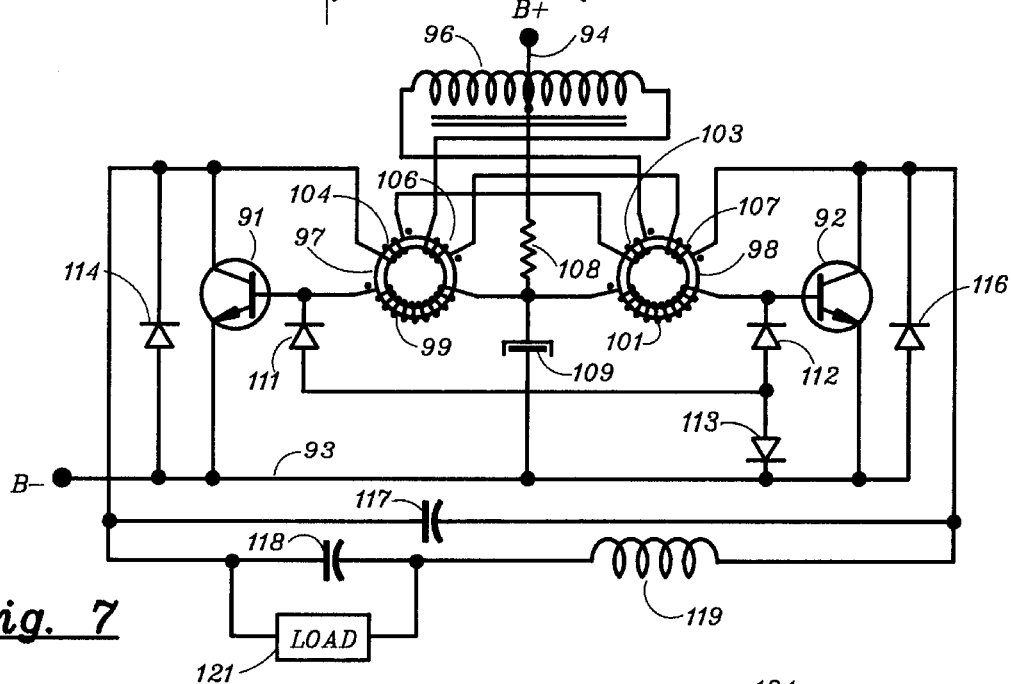
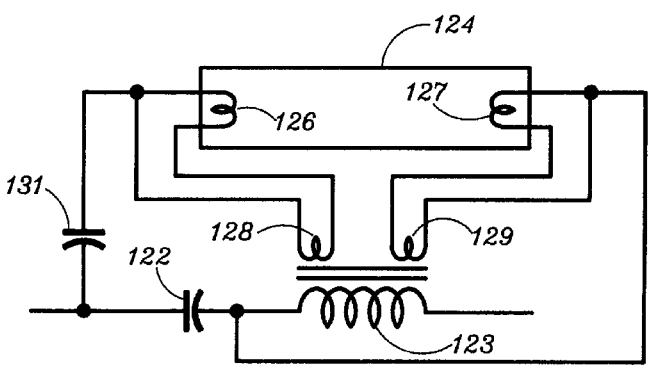

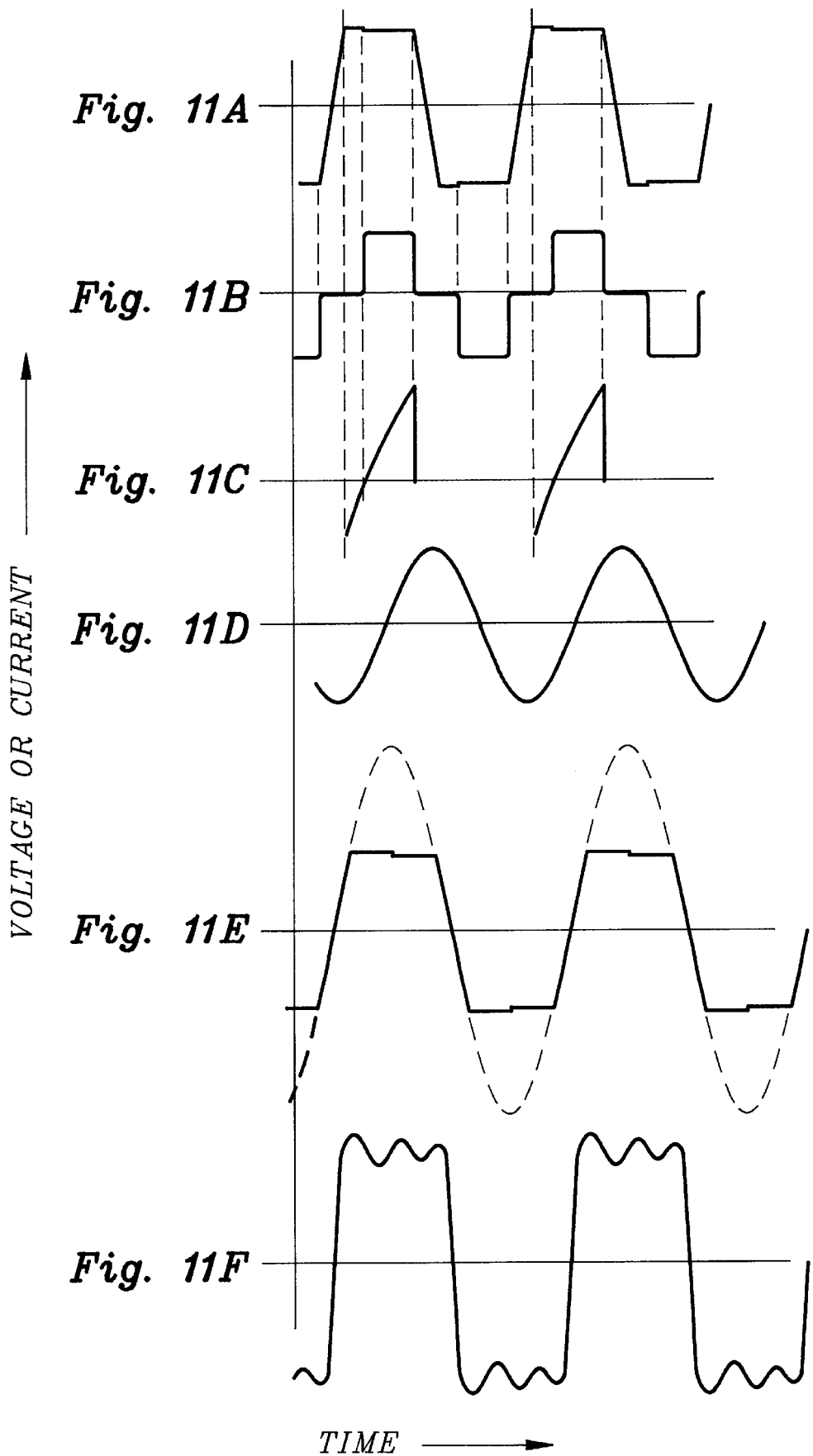

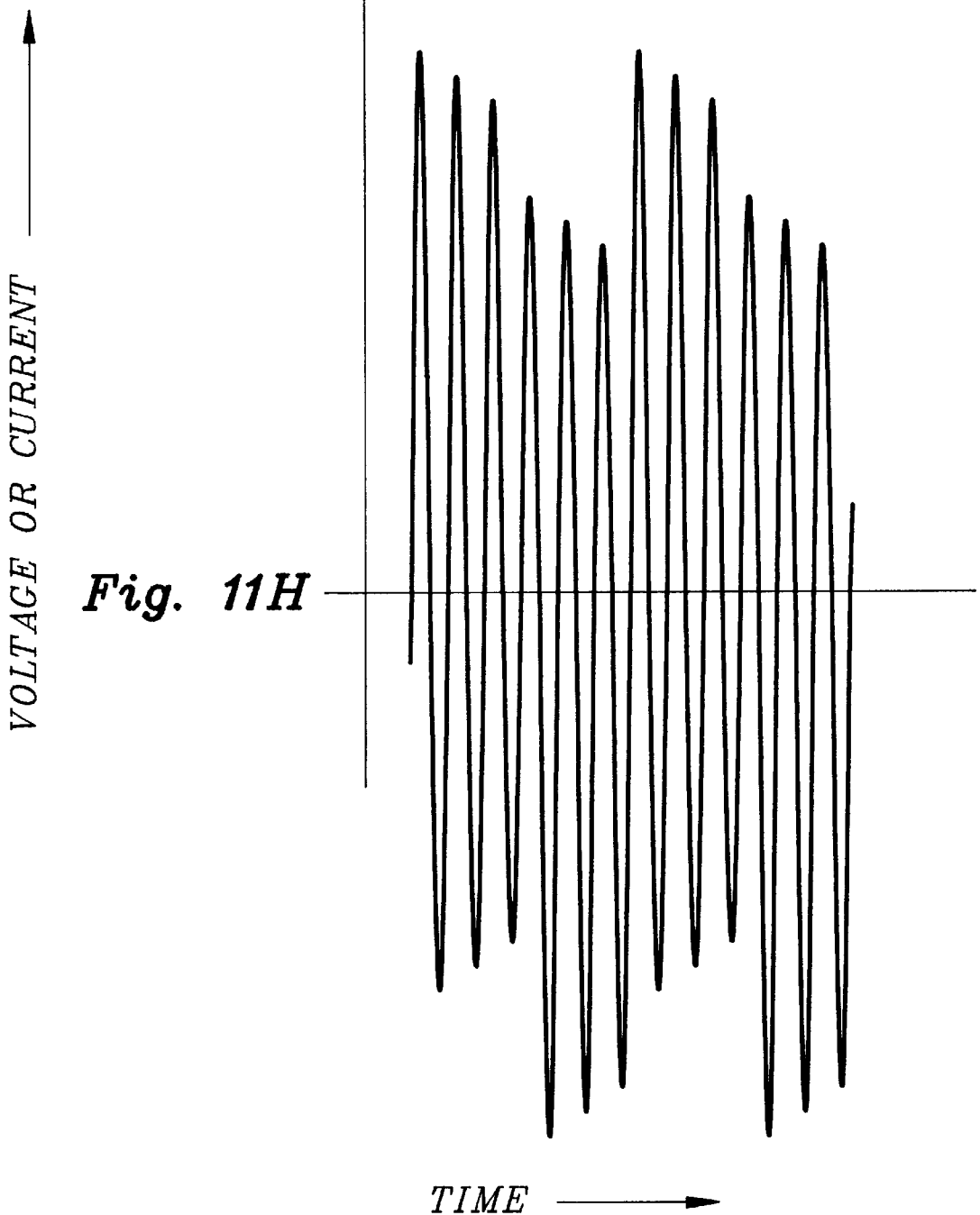

BALLAST FOR PARALLEL-CONNECTED LAMPS

Related Applications

The present application is a Continuation-in-part of Ser. No. 07/734,188 filed Jul. 22, 1991 now U.S. Pat. No. 5,428,266; which is a Continuation-in-part of Ser. No. 07/643,023 filed Jan. 18, 1991 now abandoned; which is a Continuation-in-part of Ser. No. 06/787,692 filed Oct. 15, 1985, now abandoned; which is a Continuation of Ser. No. 06/644,155 filed Aug. 27, 1984, now abandoned; which is a Continuation of Ser. No. 06/555,426 filed Nov. 23, 1983, now abandoned; which is a Continuation of Ser. No. 06/178,107 filed Aug. 14, 1980, now abandoned; which is a Continuation-in-part of Ser. No. 05/973,741 filed Dec. 28, 1978, now abandoned; which is a Continuation-in-part of Ser. No. 05/890,586 filed Mar. 20, 1978, now U.S. Pat. No. 4,184,128.

The present application is also a Continuation-in-part of Ser. No. 07/820,918 filed Jan. 15, 1992 now abandoned; which is a Continuation-in-part of Ser. No. 07/281,275 filed Dec. 8, 1988 now abandoned; which is a Continuation-in-part of Ser. No. 07/080,865 filed Aug. 3, 1987, now U.S. Patent No. 4,819,146.

FIELD OF INVENTION

This invention relates to electronic ballasts for gas discharge lamps, particularly to electronic ballasts each of which being operable to power plural parallel-connected lamps.

DESCRIPTION OF PRIOR ART

For a description of pertinent prior art, reference is made to U.S. Pat. No. 4,677,345 to Nilssen; which patent issued from a Division of application Ser. No. 06/178,107 filed Aug. 14, 1980; which application is an in-part progenitor of instant application.

Otherwise, reference is made to the following U.S. Patents: U.S. Pat. No. 3,263,122 to Genuit; U.S. Pat. No. 3,320,510 to Locklair; U.S. Pat. No. 3,996,493 to Davenport et el.; U.S. Pat. No. 4,100,476 to Ghiringhelli; U.S. Pat. No. 4,262,327 to Kovacik et al.; U.S. Pat. No. 4,370,600 to Zansky; U.S. Pat. No. 4,392,087 to Zansky; U.S. Pat. No. 4,398,126 to Zuchtriegel; U.S. Pat. No. 4,634,932 to Nilssen; and U.S. Pat. No. 4,857,806 to Nilssen.

SUMMARY OF THE INVENTION

OBJECTS OF THE INVENTION

A main object of the present invention is that of providing cost-effective ballasting means for gas discharge lamps.

This as well as other objects, features and advantages of the present invention will become apparent from the following description and claims.

BRIEF DESCRIPTION OF THE INVENTION

In an electronic ballast, a half-bridge inverter is powered from a DC voltage and provides a 40 kHz squarewave inverter output voltage. The DC voltage is obtained via a pre-converter with a control input operative to permit control of the magnitude of the DC voltage.

The 40 kHz squarewave inverter output voltage is applied across a series-resonant L-C circuit, thereby establishing a 40 kHz sinusoidal voltage across the L-C circuit's tank capacitor. By controlling the symmetry of the squarewave voltage, the magnitude of the 40 kHz sinusoidal voltage is regulated to be appropriate to instant-starting a gas discharge lamp.

Each of several instant-start fluorescent lamps is series-connected with a capacitor, such as to form several lamp-capacitor series-combinations, each of which is connected across the tank capacitor, thereby to be properly ignited and powered from the magnitude-controlled 40 kHz sinusoidal voltage.

To attain imroved efficiency of operation, after the lamps have all ignited, the magnitude of the 40 kHz sinusoidal voltage is reduced, thereby minimizing the amount of reactive power having to be handled by the resonant L-C circuit.

BRIEF DESCRIPTION OF THE DRAWINGS

FIG. 1 is a front elevation of a folded fluorescent lamp unit adapted for screw-in insertion into a standard Edison incandescent socket;

FIG. 2 is a schematic diagram illustrating the essential features of a push-pull inverter circuit particularly suitable for energizing the lamp unit of FIG. 1;

FIGS. 3A–3D is a set of waveform diagrams of certain significant voltages and currents occurring in the circuit of FIG. 2;

FIG. 4 is a schematic diagram of a DC power supply connectable to both 120 and 240 volt AC inputs;

FIG. 5 is a schematic diagram which illustrates the connection of a non-self-ballasted gas discharge lamp unit to the FIG. 2 inverter circuit;

FIG. 6 is a schematic diagram which illustrates the use of a toroid heater for regulation of the inverter frequency and thereby its output;

FIG. 7 is an alternate form of push-pull inverter circuit according to the present invention;

FIG. 8 is a schematic diagram showing the connection of a gas discharge lamp of the "rapid-start" type to an inductor-capacitor-loaded inverter according to the present invention;

FIGS. 11A–11H show various voltage and current waveforms associated with the circuit arrangement of FIG. 9.

DESCRIPTION OF INITIAL EMBODIMENTS

Figures 9, 10:
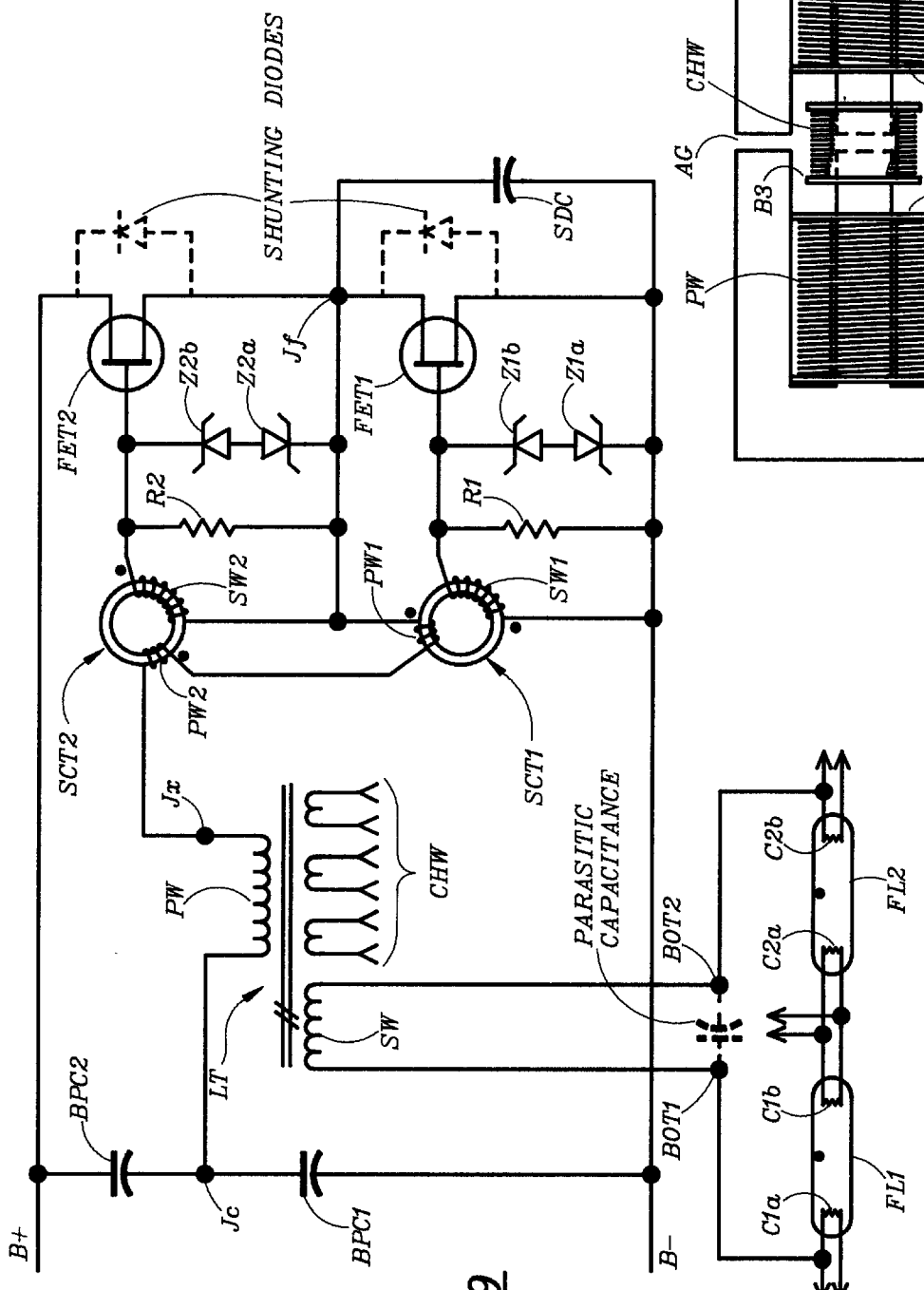
FIG. 9 is a schematic diagram illustrating an inverter ballast circuit arrangement wherein a pair of series-connected fluorescent lamps is powered, by way of a leakage transformer, from an inverter output voltage having a trapezoidal (i.e. truncated sinewave) waveform like that of FIG. 3A.
FIG. 10 is a schematic illustration of the leakage transformer used in the circuit arrangement of FIG. 9.

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from a frequency-converting power supply and ballasting circuit 16; which, because of its compact size, conveniently fits within the base 12.

The inverter circuit 16 is connected by leads 17, 18 to a screw-type plug 19 adapted for screw-in insertion into a standard Edison-type incandescent lamp socket at which ordinary 120 Volt/60 Hz power line voltage is available. A ground plane comprising a wire or metallic strip 21 is disposed adjacent a portion of the fluorescent lamp 11 as a starting aid.

Finally, a manually rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device such as the fluorescent lamp 11 of FIG. 1.

The power supply 23 comprises bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+ line 38 and a B− line 39, respectively. The power supply 23 also comprises a voltage doubler and rectifier optionally connectable to a 120 volt AC input taken between the ground line 37 and terminal 33 or 32. The voltage doubler and rectifier means provides a direct electrical connection by way of line 37 between one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+ line 38 and −60 volts on the B− line 39.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+ and B− lines 38 and 39, respectively. The collector of transistor 42 is connected to the B+ line 38, the emitter of transistor 42 and the collector of transistor 43 are connected to a midpoint line 44 (designated "M") and the emitter of transistor 43 is connected to the B− line 39. The midpoint line 44 is in turn connected to the ground line 37 through primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation in this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B− lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 62 in turn connected to the midpoint line 44; similarly, a diode 63 and series Zener diode 64 in turn connected to the B− line 39 can be connected to the base of transistor 43. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals, as will be seen presently.

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+ line 38 through windings 46 and 48 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become non-conductive. As shown in FIG. 3c, current-flow in transistor 43 terminates at the end of period I.

Because the current through inductor 51 cannot change instantaneously, current will flow from the B− bus 39 through capacitor 68, causing the voltage at midpoint line 44 to drop to −160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B− bus through the shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint line 44 to rise (period V). When the voltage at the midpoint line M reaches 160 volts, the current will then flow through shunt diode 66 (period VI). The cycle is then repeated.

As seen in FIG. 3, saturable transformers 47, 49 provide transistor drive current only after the current through inductor 51 has diminished to zero. Further, the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of the inductor 51 and the capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equal to or higher than the natural resonance frequency of the inductor and capacitor combination in order to provide a high voltage output to external load 26. A high voltage across capacitor 52 is efficiently developed as the transistor inversion frequency approaches the natural resonant frequency of the inductor 51 and capacitor 52 combination. Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor may be omitted entirely. If the combined circuit loading of the inductor 51 and the external load 26 has an effective inductance of value sufficient to effect periodic energy storage for self-sustained transistor inversion, the current feedback provided by the saturable inductors 47, 49 will effect alternate transistor conduction without the need for additional voltage feedback. When the capacitor 52 is omitted, the power supply 23 provides a direct electrical connection between one of the AC power input lines and the inverter load circuit.

Because the voltages across transistors 42, 43 are relatively low (due to the effect of capacitors 34, 36), the half-bridge inverter 24 is very reliable. The absence of switching transients minimizes the possibility of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103,624 filed Dec. 14, 1979 and entitled "Bias Control for High Efficiency Inverter Circuit" (now U.S. Pat. No. 4,307,353). The more negative the voltage on the bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 Volt for transistors typically used in high-voltage inverters. As an alternative, to provide a negative voltage smaller in magnitude on the base lead of typical transistor 42 during reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impedance means and correspondingly modify the inverter output. Thus as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp. This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B− line 93. A B+ lead 94 is connected to the center-tap of a transformer 96. In order to provide drive current to the transistors 91, 92 for control of their conduction frequency, saturable inductors 97, 98 have secondary windings 99, 101, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+ terminal is connected to terminal 102 through a bias resistor 108. A bias capacitor 109 connects terminal 102 to the B− lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B− lead 93. The common Zener diode 113 serves the same function as individual Zener diodes 62, 64 in FIG. 2.

Shunt diodes 114, 116 are connected across the collector-emitter terminals of transistors 91, 92, respectively.

A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with with an inductor 119, the combination being connected across the collectors of the transistors 91, 92. A load 121 is connected across the capacitor 118.

FIG. 8 illustrates how an inverter loaded with a series capacitor 122 and inductor 123 can be used to energize a "rapid-start" fluorescent lamp 124 (the details of the inverter circuit being omitted for simplification). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

FIG. 9 shows an embodiment of the present invention that is expressly aimed at an alternative way of taking advantage of the fact that the inverter output voltage of the inverter circuit arrangement of FIG. 2 has the particular trapezoidal waveshape illustrated by FIG. 3A.

In FIG. 9, a DC supply voltage of about 320 Volt is assumed to be provided between a B− bus and a B+ bus.

A first high-frequency bypass capacitor BPC1 is connected between the B− bus and a junction Jc; and a second high-frequency bypass capacitor BPC2 is connected between junction Jc and the B+ bus. The source of a first field effect transistor FET1 is connected with the B− bus, while the drain of this same transistor is connected with a junction Jf. The source of a second field effect transistor FET2 is connected with junction Jf, while the drain of this same transistor is connected with the B+ bus. As shown in dashed outline, each field effect transistor has a commutating diode built-in between its drain and source. A slow-down capacitor SDC is connected between junction Jf and the B− bus.

The primary winding PW of a leakage transformer LT is connected between junction Jc and a junction Jx; the primary winding PW1 of a first saturable current transformer SCT1 is series-connected with the primary winding PW2 of a second saturable current transformer SCT2 between junctions Jf and Jx.

A secondary winding SW1 of transformer SCT1 is connected between the source and gate terminals of FET1; and a secondary winding SW2 of transformer SCT2 is connected between the source and gate terminals of FET2. A resistor R1 is connected across secondary winding SW1; and a resistor R2 is connected across secondary winding SW2. A Zener diode Z1a is connected with its cathode to the source of FET1 and with its anode to the anode of a Zener diode Z1b, whose cathode is connected with the gate of FET1. A Zener diode Z2a is connected with its cathode to the source of FET2 and with its anode to the anode of a Zener diode Z2b, whose cathode is connected with the gate of FET2.

A secondary winding SW of leakage transformer LT is connected between ballast output terminals BOT1 and BOT2.

A first fluorescent lamp FL1 is series-connected with a second fluorescent lamp FL2 to form a series-combination; which series-combination is connected between ballasts output terminals BOT1 and BOT2. Lamp FL1 has a first cathode C1a and a second cathode C1b; while lamp FL2 has a first cathode C2a and a second cathode C2b. Each cathode has two cathode terminals. Each of the terminals of cathode C1b is connected with one of the terminals of cathode C2a. Each cathode's terminals are connected with the terminals of one of three separate cathode heater windings CHW.

The leakage transformer of FIG. 9 is illustrated in further detail in FIG. 10. In particular and by way of example, leakage transformer LT includes a first and a second ferrite core element FC1 and FC2, each of which is an extra long so-called E-core; which E-cores abut each other across an air gap AG. Primary winding PW is wound on a first bobbin B1; and secondary winding SW is wound on a second bobbin B2. Cathode heating windings CHW are wound on a small third bobbin B3; which bobbin B3 is adjustably positioned between bobbins B1 and B2.

The operation of the circuit arrangement of FIG. 9 may best be understood by referring to the voltage and current waveforms of FIGS. 11A to 11F.

FIG. 11A shows the waveform of the voltage provided at the output of the half-bridge inverter of FIG. 9 during a situation where lamps FL1 and FL2 are being fully powered. In particular, FIG. 11A shows the waveform of the voltage provided at junction Jf as measured with reference to junction Jc. (The voltage at Jx is substantially equal to the voltage at Jf).

This waveform is substantially equal to that of FIG. 3A.

FIG. 11B shows the corresponding waveform of the gate-to-source voltage (i.e. the control voltage) of FET2.

FIG. 11C shows the corresponding drain current flowing through FET2; which is the current drawn by the upper half of the half-bridge inverter from the DC supply voltage (i.e., from the B+ bus).

FIG. 11D shows the corresponding current flowing through fluorescent lamps FL1 and FL2.

FIG. 11E shows the waveform of the voltage provided at the output of the half-bridge inverter of FIG. 9 for a situation where ballast output terminals BOT1/BOT2 are unloaded except for stray (or parasitic) capacitance associated with the wiring extending between ballast output terminals BOT1/BOT2 and lamp cathodes C1a and C2b.

The waveform of FIG. 11E is substantially equal to that of FIG. 11A except for an increase in the duration of each cycle period.

FIG. 11F shows the corresponding open circuit output voltage present across ballast output terminals BOT1 and BOT2.

FIG. 11G shows the waveform of the voltage provided at the output of the half-bridge inverter of FIG. 9 for a situation where: (i) slowdown capacitor SDC has been removed; and (ii) ballast output terminals BOT1/BOT2 are unloaded except for stray (or parasitic) capacitance associated with the wiring extending between ballast output terminals BOT1/BOT2 and lamp cathodes C1a and C2b.

It is noted that the waveform of FIG. 11G is substantially a true squarewave as opposed to the trapezoidal (or truncated sinusoidal) waveforms of FIGS. 11A and 11E.

FIG. 11H shows the waveform of the corresponding voltage present across ballast output terminals BOT1 and BOT2.

The basic inverter part of FIG. 9 operates much like the inverter part of FIG. 2, except that the switching transistors are field effect transistors instead of bi-polar transistors.

The loading of the inverter, however, is different. In the circuit of FIG. 9, the inverter's output voltage is applied to the primary winding of a leakage transformer (LT); and the output is drawn from a primary winding of this leakage transformer. In this connection, it is important to notice that a leakage transformer is a transformer wherein there is substantial leakage of magnetic flux between the primary winding and the secondary winding; which is to say that a substantial part of the flux generated by the transformer's primary winding does not link with the transformer's secondary winding.

The flux leakage aspect of transformer LT is illustrated by the structure of FIG. 10. Magnetic flux generated by (and emanating from) primary winding PW passes readily through the high-permeability ferrite of ferrite core FC1. However, as long as secondary winding SW is connected with a load at its output (and/or if there is an air gap, as indeed there is), the flux emanating from the primary winding has to overcome magnetic impedance to flow through the secondary winding; which implies the development of a magnetic potential difference between the legs of the long E-cores—especially between the legs of ferrite core FC1. In turn, this magnetic potential difference causes some of the magnetic flux generated by the primary winding to flow directly between the legs of the E-cores (i.e. directly across the air gap between the legs of the E-cores), thereby not linking with (i.e. flowing through) the secondary winding. Thus, the longer the legs of the E-cores and/or the larger the air gap, the less of the flux generated by the primary winding links with the secondary winding—and conversely. As a result, the magnitude of the current available from the secondary winding is limited by an equivalent internal inductance.

Due to the substantial air gap (AG), the primary winding of leakage transformer LT is capable of storing a substantial amount of inductive energy (just as is the case with inductor 51 of FIG. 2). Stated differently but equivalently, leakage transformer LT has an equivalent input-shunt inductance (existing across the input terminals of its primary or input winding) capable of storing a substantial amount of energy. It also has an equivalent output-series inductance (effectively existing in series with the output terminals of its secondary or output winding) operative to limit the magnitude of the current available from its output. It is important to recognize that the input-shunt inductance is an entity quite separate and apart from the output-series inductance.

Just as in the circuit of FIG. 2, when one of the transistors is switched OFF, the current flowing through primary winding PW can not instantaneously stop flowing. Instead, it must continue to flow until the energy stored in the input-shunt inductance is dissipated and/or discharged. In particular and by way of example, at the moment FET2 is switched OFF, current flows through primary winding PW, entering at the terminal connected with junction Jx and exiting at the terminal connected with junction Jc. Just after the point in time where FET2 is switched OFF, this current will continue to flow, but—since it can not any longer flow through transistor FET2—it must now flow through slow-down capacitor SDC. Thus, the current drawn out of capacitor SDC will cause this capacitor to change its voltage: gradually causing it to decrease from a magnitude of about +160 Volt (which is the magnitude of the DC supply voltage present at the B+ bus as referenced-to junction Jc) to about −160 Volt (which is the magnitude of the DC supply voltage present at the B− bus as referended-to junction Jc). Of course, as soon as it reaches about −160 Volt, it gets clamped by the commutating (or shunting, or clamping) diode built-into FET1; which built-in diode corresponds to shunting diode 67 of the FIG. 2 circuit.

The resulting waveform of the inverter's output voltage will be as illustrated by FIGS. 11A and 11E. The slope of the inverter output voltage as it alternatingly changes between −160 Volt and +160 Volt is determined by two principal factors: (i) the value of the input-shunt inductance of primary winding PW; and (ii) the magnitude of slow-down capacitor SDC. The lower the capacitance of the slow-down capacitor, the steeper the slope. The lower the inductance of the input-shunt inductance, the steeper the slope. Without any slow-down capacitor, the slope will be very steep: limited entirely by the basic switching speed of the inverter's transistors; which, for field effect transistors is particularly high (i.e. fast).

In particular, in the circuit of FIG. 9, the relatively modest up- and down-slopes of the inverter's output voltage (see waveforms of FIGS. 11A and 11E)—which are determined by the capacitance of the slow-down capacitor—are chosen to be far lower than the very steep slopes that result when the slow-down capacitor is removed; which latter situation is illustrated by FIG. 11G. In fact, the slopes of the inverter's output voltage are chosen in such manner as to result in this output voltage having a particularly low content of harmonic components, thereby minimizing potential problems associated with unwanted resonances of the output-series inductance with parasitic capacitances apt to be connected with ballast output terminals BOT1/BOT2 by way of more-or-less ordinary wiring harness means used for connecting between these output terminals and the associated fluorescent lamps (FL1 and FL2).

With the preferred capacitance value of slow-down capacitor SDC, the inverter output voltage waveform will be as shown in FIG. 11E, and the output voltage provided from secondary winding SW—under a condition of no load other than that resulting from a parasitic resonance involving a worst-value of parasitic output capacitance—will be as shown in FIG. 11F.

On the other hand, without having any slow-down capacitor, the inverter output voltage waveform will be as shown in FIG. 11G, and the output voltage provided from secondary winding SW—under a condition of no load other than that resulting from a parasitic resonance involving a worst-value of parasitic output capacitance—will be as shown in FIG. 11H. Under this condition, the power drawn by the inverter from its DC supply is more than 50 Watt; which power drain result from power dissipations within the inverter circuit and—if permitted to occur for more than a very short period—will cause the inverter to self-destruct.

On the other hand, the power drawn by the inverter under the same identical condition except for having modified the shape of the inverter's output voltage to be like that of FIG. 11E (instead of being like that of FIG. 11G) is only about 3 Watt; which amount of power drain is small enough not to pose any problem with respect to inverter self-destruction, nor even with respect to excessive power usage during extended periods where the inverter ballast is connected with its power source but without actually powering its fluorescent lamp load.

One difference between the circuit of FIG. 2 and that of FIG. 9 involves that fact that the FIG. 9 circuit uses field effect transistors. Never-the-less, the control of each transistor is effected by way of saturable current feedback transformers. However, instead of delivering its output current to a base-emitter junction, each current transformer now delivers its output current to a pair of series-connected opposed-polarity Zener diodes (as parallel-connected with a damping resistor and the gate-source input capacitance). The resulting difference in each transistor's control voltage is seen by comparing the waveform of FIG. 3B with that of FIG. 11B. In either case, however, the transistor is not switched into its ON-state until after the absolute magnitude of the voltage across its switched terminals (i.e. the source-drain terminals for a FET) has substantially diminished to zero.

In further contrast with the arrangement of FIG. 2, the inverter circuit of FIG. 9 is not loaded by way of a series-tuned L-C circuit. Instead, it is in fact loaded with a parallel-tuned L-C circuit; which parallel-tuned L-C circuit consists of the slow-down capacitor SDC as parallel-connected with the input-shunt inductance of primary winding PW. Yet, in complete contrast with other inverters loaded with parallel-tuned L-C circuits, the inverter of FIG. 9 is powered from a voltage source providing a substantially fixed-magnitude (i.e. non-varying) DC voltage.

Also in complete contrast with other inverters loaded with parallel-tuned L-C circuits, the inverter circuit of FIG. 9 provides for clamping (or clipping or truncating) of the naturally sinusoidal resonance voltage that would otherwise (i.e. in the absence of clamping) develop across the parallel-tuned L-C circuit; which naturally sinusoidal resonance voltage is illustrated by the dashed waveform of FIG. 11E.

In the FIG. 9 circuit, the indicated voltage clamping (or clipping or truncating) is accomplished by way of the commutating (or shunting) diodes built into each of the field effect switching transistors. In the FIG. 2 circuit, this clamping is accomplished by shunting diodes 66 and 67.

As previously indicated, to minimize the spurious and potentially damaging resonances which might occur due to an unknown parasitic capacitance becoming connected with ballast output terminals BOT1 and BOT2, it is important to minimize the harmonic content of the inverter's output voltage (which harmonic content—for a symmetrical inverter waveform—consists of all the odd harmonics in proportionally diminishing magnitudes). To attain such harmonic minimization, it is important that the inverter's output voltage be made to match or fit as nearly as possible the waveform of a sinusoidal voltage; which "best fit" occurs when the duration of the up/down-slopes equals about 25% of the total cycle period; which, as can readily be seen by direct visual inspection, corresponds closely to the waveforms actually depicted by FIGS. 3A, 11A and 11E.

However, substantial beneficial effects actually results even if the total duration of the up/down slopes were to be less than 25% of the total duration of the inverter output voltage period. In fact, substantial beneficial effects are attained with up-down slopes constituting as little as 10% of the total cycle period.

DESCRIPTION OF SPECIAL EMBODIMENT

Figure 12:
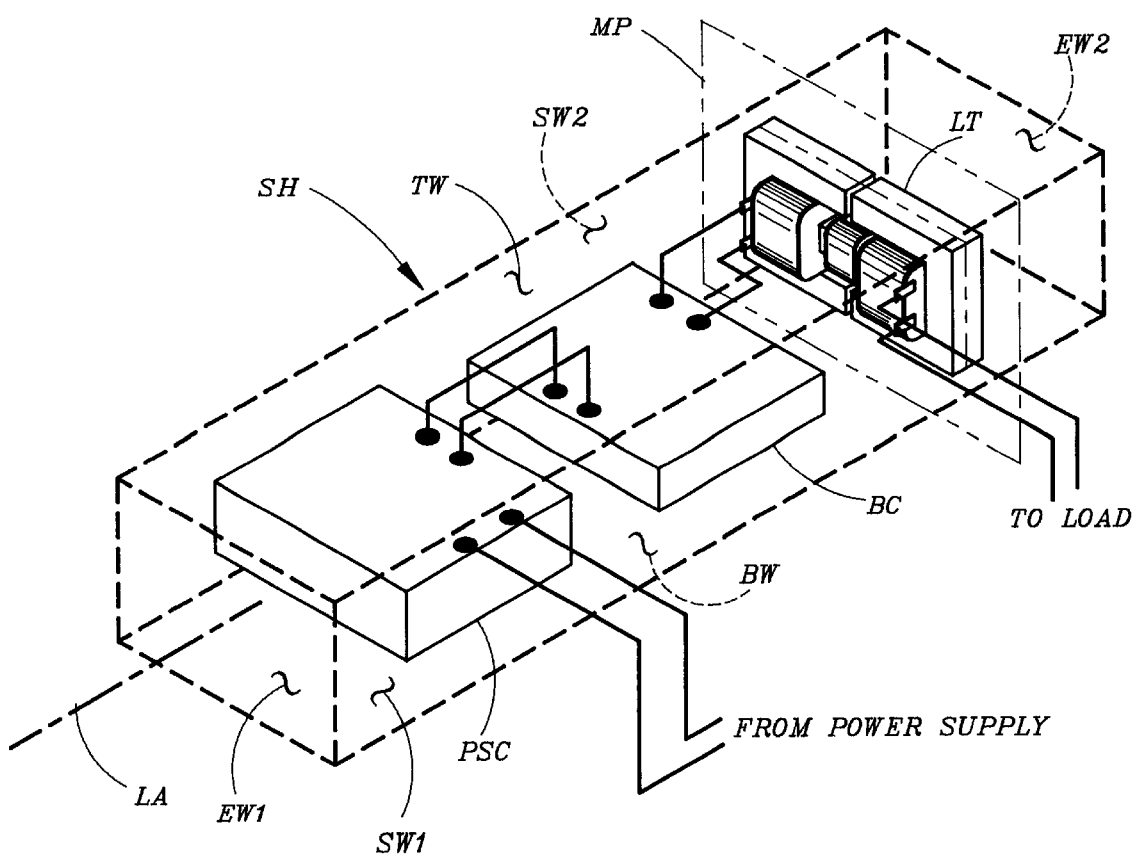
FIG. 12 shows the orientation of the leakage transformer within a conventional steel ballast housing.

A special embodiment of the present invention includes the circuit illustrated in FIG. 9 mounted within a steel housing such as that illustrated by FIG. 12.

A steel housing SH has a longitudinal axis LA, a bottom wall BW, a top wall TW, side walls SW1 and SW2, and end walls EW1 and EW2.

Within steel housing SH is mounted a power supply circuit PSC (such as that indicated by element 23 in FIG. 2). This power supply circuit is connected with a ballast circuit BC; which ballast circuit preferably includes the circuitry of FIG. 9, except for its leakage transformer LT; which leakage transformer is shown as a separate entity mounted in such manner as to have its main plane MP—i.e., a plane parallel to the magnetic flux in its ferrite core—disposed perpendicularly to longitudinal axis LA of the steel housing SH. Also, leakage transformer LT is mounted a substantial distance away from end walls EW1 and EW2 of steel housing SH.

As with any leakage transformer, leakage transformer LT has a magnetic leakage flux; which magnetic leakage flux—for the E-core-type leakage transformer actually illustrated—extends mainly into the air space at each side of the leakage transformer's main plane. However, the density (or intensity) of the leakage flux diminishes sharply with distance away from the leakage transformer's main plane. Thus, to minimize the degree to which this leakage flux couples with the walls of the steel housing (thereby to minimize concomitant wasteful power dissipation) it is important to locate these walls as far away as reasonably possible from the leakage flux.

Since it is indeed for several practical reasons desirable that the housing be made of steel, and since the size and shape of the steel housing is to a large extent given, the only realistic option available for minimizing useless power dissipation in an electronic ballasts with a leakage transformer is to locate this leakage transformer within the steel housing in such manner as to minimize the degree with which the leakage flux couples with the steel walls of the housing.

Ideally, minimum coupling would result with the leakage transformer disposed in the exact middle of the steel housing, with its main plain perpendicular to the housing's longitudinal axis. However, for most practical purposes, it is entirely sufficient to position the leakage transformer somewhat off center, such as indicated in FIG. 12.

Ordinarily, for ease of assembly, E-core-type transformers in electronic ballasts are located within the steel housing such that the transformer's main plane is parallel with the housing's bottom/top walls BW/TW; which is the absolute worst location with respect to generating unnecessary power losses.

The dimensions of a commonly used steel casing for electronic ballasts are as follows: bottom wall BW and top wall TW are each about 2.3" wide and 8.2" long; side walls SW1 and SW2 are each about 1.5" high and 8.2" long; and end walls EW1 and EW2 are each about 2.3" wide and 1.5" high.

Thus, for ballast housings with aspect ratios approximately like those of the above-indicated commonly used steel housing, a most energy-efficient location for the leakage transformer is as shown in FIG. 12. Never-the-less, any position where the transformer's main plane is substantially perpendicular to the plane of bottom wall BW is substantially more efficient that a position where the transformer's main plane is parallel with the bottom wall.

It is also important to position the leakage transformer about in the middle between bottom wall BW and top wall TW.

Additional Explanations and Comments (a) With reference to FIGS. 2 and 5, adjustment of the amount of power supplied to load 26', and thereby the amount of light provided by lamp 71, may be accomplished by applying a voltage of adjustable magnitude to input terminals IP1 and IP2 of the Toroid Heater; which is thermally coupled with the toroidal ferrite cores of saturable transformers 47, 49.

(b) With commonly available components, inverter circuit 24 of FIG. 2 can be made to operate efficiently at any frequency between a few kHz to perhaps as high as 50 kHz. However, for various well-known reasons (i.e., eliminating audible noise, minimizing physical size, and maximizing efficiency), the frequency actually chosen is in the range of 20 to 40 kHz.

(c) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

(d) At frequencies above a fewkHz, the load represented by a fluorescent lamp—once it is ignited—is substantially resistive. Thus, with the voltage across lamp 11 being of a substantially sinusoidal waveform (as indicated in FIG. 3d), the current through the lamp will also be substantially sinusoidal in waveshape.

(e) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps—such as lamp 11 of FIG. 1—the two terminals from each cathode are shorted together, thereby to constitute a situation where each cathode effectively is represented by only a single terminal. However, it is not necessary that the two terminals from each cathode be shorted together; in which case—for instant-start operation—connection from a lamp's power supply and ballasting means need only be made with one of the terminals of each cathode.

(f) In FIG. 9, a Parasitic Capacitance is shown as being connected across terminals BOT1 and BOT2. The value of this parasitic capacitance may vary over a wide range, depending on unpredictable details of the particular usage situation at hand. Values for the parasitic capacitance will expectedly vary between 100 and 1000 pico-Farad—depending on the nature of the wiring harness used for connecting between the output of secondary winding SW and the plural terminals of lamps FL1/FL2.

(g) The worst case of parasitic oscillation associated with the circuit arrangement of FIG. 9 is apt to occur when the value of the parasitic capacitance (i.e., the capacitance of the ballast-to-lamp wiring harness) is such as to cause series-resonance with the output-series inductance of secondary winding SW at the third harmonic component of the inverter's output voltage. The next worst case of parasitic oscillation is apt to occur when the value of the parasitic capacitance is such as to series-resonate with the output-series inductance at the fifth harmonic component of the inverter's output voltage. With the typical value of 5.4 milli-Henry for the output-series inductance, it takes a total of about 600 pico-Farad to resonate at the third harmonic component of the inverter's 30 kHz output voltage; and it takes about 220 pico-Farad to resonate at the fifth harmonic component of the inverter's output voltage. These capacitance values are indeed of such magnitudes that they may be encountered in an actual usage situation of an electronic ballast. Moreover, at higher inverter frequencies, the magnitudes of the critical capacitance values become even lower.

(h) FIG. 10 shows cathode heater windings CHW placed on a bobbin separate from that of primary winding PW as well as separate from that of secondary winding SW. However, in many situations, it would be better to place the cathode heater windings directly onto the primary winding bobbin B1. In other situations it would be better to place the cathode heater windings directly onto the secondary winding bobbin B2.

If the cathode heater windings are wound on bobbin B1 (i.e. in tight coupling with the primary winding), the magnitude of the cathode heating voltage will remain constant regardless of whether or not the lamp is ignited; which effect is conducive to maximixing lamp life. On the other hand, if the cathode heater windings are wound on bobbin B2 (i.e. in tight coupling with the secondary winding), the magnitude of the cathode heating voltage will be high prior to lamp ignition and low after lamp ignition; which effect is conducive to high luminous efficacy.

By placing the cathode heater windings in a location between primary winding PW and secondary winding SW, it is possible to attain an optimization effect: a maximization of luminous efficacy combined with only a modest sacrifice in lamp life. That is, by adjusting the position of bobbin B3, a corresponding adjustment of the ratio of pre-ignition to post-ignition cathode heater voltage magnitude may be accomplished.

(i) For easier lamp starting, a starting aid capacitor may be used in shunt across one of the fluorescent lamps FL1/FL2.

Also, a starting aid electrode (or ground plane) may advantageously be placed adjacent the fluorescent lamps; which starting aid electrode should be electrically connected with the secondary winding, such as via a capacitor of low capacitance value.

(j) To control (reduce) the degree of magnetic coupling between primary winding PW and secondary winding SW, a magnetic shunt may be positioned across the legs of the E-cores—in a position between bobbins B1 and B3.

(k) Considering the waveforms of FIGS. 1A, 11A and 11E each to include 360 degrees for each full and complete cycle: (i) each half-cycle would include 180 degrees; (ii) each total up-slope would include almost or about 60 degrees degrees; (iii) each total down-slope would include almost or about 60 degrees; and (iv) each horizontal segment would include about 120 degrees or more. Yet, as previously indicated, substantial utility may be attained even if each complete up-slope and down-slope were to include as little 18 degrees.

(l) In the FIG. 9 circuit, the inverter's operating frequency is not ordinarily (or necessarily) equal to the natural resonance frequency of the parallel-tuned L-C circuit that consists of slow-down capacitor SDC and the input-shunt inductance of primary winding PW. Rather, the inverter's actual operating frequency is ordinarily lower than would be this natural resonance frequency.

(m) In a trapezoidal waveform that constitutes a best fit for a sinusoidal waveform, the peak magnitude is lower than that of the sinusoidal waveform, and the up-slope and down-slope are each steeper that the corresponding slopes of the sinusoidal waveform.

(n) The FIG. 9 inverter arrangement has to be triggered into self-oscillation. A suitable automatic triggering means would include a resistor, a capacitor, and a so-called Diac. However, manual triggering may be accomplished by merely momentarily connecting a discharged capacitor (of relatively small capacitance value) between the gate of transistor FET1 and the B+ bus.

(o) Most switching-type field effect transistors have built-in commutating (or shunting) diodes, as indicated in FIG. 9. However, if such were not to be the case, such diodes should be added externally, as indicated in the FIG. 2 circuit.

(p) In ordinary inverter circuits, the inverter output voltage is effectively a squarewave voltage with very steep up-slopes and down-slopes. In inverters using so-called field effect transistors, the time required for the inverter's square-wave output voltage to change between its extreme negative potential to its extreme positive potential is usually on the order of 100 nano-seconds or less. In inverters using bi-polar transistors, this time is usually on the order of 500 nano-seconds or less. In the inverter of the FIG. 9 circuit, however, this time has been extended—by way of the large-capacitance-value slow-down capacitor SDC—to be on the order of several micro-seconds, thereby achieving a substantial reduction of the magnitudes of the harmonic components of the inverter's (now trapezoidal) output voltage.

(q) In an actual prototype of the FIG. 9 ballast circuit—which prototype was designed to properly power two 48 inch 40 Watt T-12 fluorescent lamps—the following approximate parameters and operating results prevailed:

1. operating frequency: about 30 kHz;
2. slow-down capacitor: 0.02 micro-Farad;
3. shunt-input inductance: 1.4 milli-Henry;
4. up-slope duration: about 4 micro-seconds;
5. down-slope duration: about 4 micro-seconds;
6. series-output inductance: 5.4 milli-Henry;
7. parasitic capacitance across BOT1/BOT2 terminals; 800 pico-Farad;
8. power consumption when unloaded: about 4 Watt;
9. power consumption when loaded with two F40/T12 fluorescent lamps: about 70 Watt;
10. power consumption when unloaded but with slow-down capacitor removed: about 80 Watt.

It is be noted that the natural resonance frequency of the L-C circuit consisting of a slow-down capacitor of 0.02 micro-Farad as parallel-combined with a shunt-input inductance of about 1.4 milli-Henry is about 30 kHz. This means that—as far as the fundamental component of the 30 kHz inverter output voltage is concerned—the parallel-tuned L-C circuit represents a very high impedance, thereby constituting no substantive loading on the inverter's output.

(r) Of course, the FIG. 9 ballast circuit can be made in the form of a push-pull circuit such as illustrated by FIG. 7; in which case center-tapped transformer 96 would be modified in the sense of being made as a leakage transformer in full correspondence with leakage transformer LT of FIG. 9. Also, of course, inductor 119, capacitor 118, and load 121 would be removed. Instead, the load would be placed at the output of the secondary winding of the modified center-tapped transformer 96; which would be made such as to have appropriate values of input-shunt inductance and output-series inductance. Capacitor 117 would constitute the slow-down capacitor.

(s) The ballast housing illustrated in FIG. 12 would ordinarily be made of steel. However, it might be made of other materials, such as aluminum. Never-the-less, except if properly orienting the leakage transformer, substantial losses may still result due to coupling of the leakage flux to the walls of the housing.

(t) The shape of the ballast housing of FIG. 12 may be described as parallelepiped. Alternatively, it may be described as being a cylinder with a substantially rectangular cross-section. This cylinder would typically be about 8.2" long; and its approximately rectangular cross-section would be about 2.3" wide and about 1.5" high.

(u) The magnetic core of leakage transformer LT is actually a ferro-magnetic core made of ferrite. The magnetic flux lines in this ferro-magnetic core are substantially parallel with each other; and the a plane passing through the middle of the ferrite core and oriented parallel with the magnetic flux lines therein is referred-to as the main plane of the magnetic core or of the leakage transformer.

DESCRIPTION OF A FOURTH CIRCUIT EMBODIMENT

Figure 13:
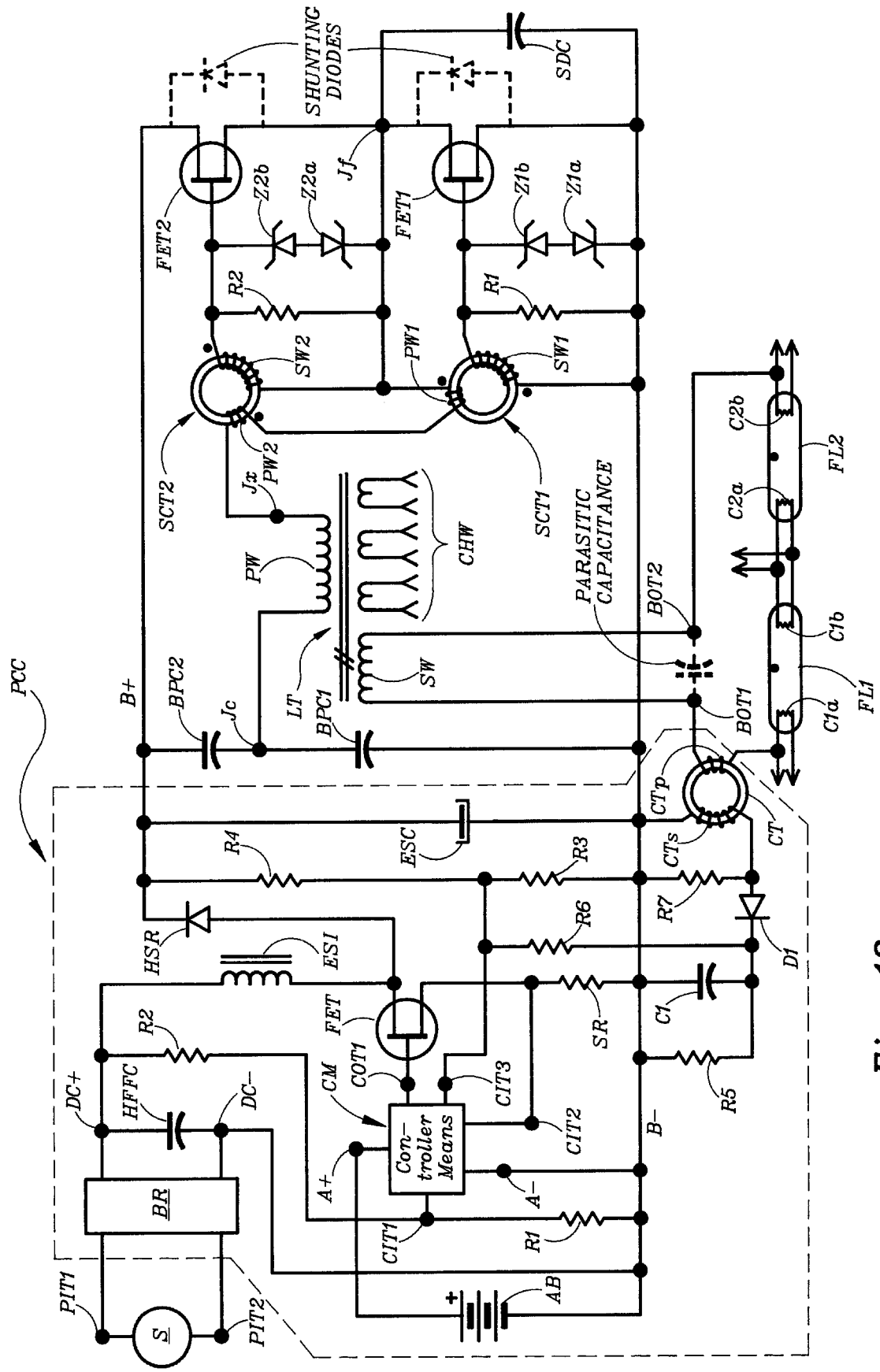
FIG. 13 illustrates the addition, to the circuit arrangement in FIG. 9, of a pre-converter-type DC power supply with means for controlling the magnitude DC voltage by way of a control input at the pre-converter.

FIG. 13 is a schematic diagram representing a fourth circuit embodiment of the invention.

Basically, FIG. 13 represents a ballast, such as that of FIG. 9, but with a pre-converter-type power supply operative to draw power from the power line with a particularly high power factor. The pre-converter uses a conventional integrated circuit controller, such as Motorola's MC34261; which controller, via a FET and an energy-storing inductor, is operable to provide a DC supply voltage of chosen constant magnitude; which magnitude can be set by feeding back, to a control input at the controller, a proportional measure of the DC magnitude. Then, by choosing the proportion of the DC voltage fed back, the magnitude of the DC voltage can be set to a desired constant level.

Details of Construction of Fourth Circuit Embodiment

FIG. 13 includes the circuit of FIG. 9 in its totality. However, for current-magnitude control purposes, primary winding CTp of a current transformer CT has been series-connected with the lead connecting ballast output terminal BOT1 with cathode C1a.

Otherwise, FIG. 13 includes a pre-converter circuit PCC; which pre-converter circuit has a bridge rectifier BR with a pair of power input terminals PIT1 and PIT2 connected with a source S of ordinary power line voltage. Across DC output terminals DC− and DC+ of the bridge rectifier is connected a high-frequency filter capacitor HFFC. The DC− terminal is connected directly with the B− bus.

A controller means CM has a positive power input terminal A+ and a negative power input terminal A−, which A− terminal is connected with the B− bus. An "A" battery AB is connected with its positive terminal to the A+ terminal and with its negative terminal to the B− bus.

The controller means has: (i) a first control input terminal CIT1, which is connected with the B− bus via a resistor R1 and with the DC+ terminal via a resistor R2; (ii) a second control input terminal CIT2, which is connected with the B− bus via a sampling resistor SR; (iii) a third control input terminal CIT3, which is connected with the B− bus via a resistor R3 and with the B+ bus via a resistor R4; and (iv) a control output terminal COT1, which is connected with the gate terminal of a field effect transistor FET.

An energy-storing inductor ESI is connected between the DC+ terminal and the drain terminal of transistor FET; which drain terminal is also connected with the anode of a high-speed rectifier HSR, whose cathode is connected with the B+ bus. The source terminal of transistor FET is connected with the B− bus via sampling resistor SR as well as with terminal CIT2 of controller means CM. An energy-storing capacitor ESC is connected between the B− bus and the B+ bus.

The output terminals of secondary winding CTs of current transformer CT are connected between the B− bus and the anode of a diode D1, whose cathode is connected with the B− bus via a resistor R5. A resistor R6 is connected between the cathode of diode D1 and terminal CIT3 of controller means CM; and a capacitor C1 is connected between the cathode of diode D1 and the B− bus. A resistor R7 is connected across the output terminals of secondary winding CTs.

Details of Operation of Fourth Circuit Embodiment

As far as the basic ballasting function is concerned, the operation of the circuit arrangement of FIG. 13 is substantially the same as that of the circuit arrangement of FIG. 9. The only significant differences relate to how the DC supply voltage is obtained and how its magnitude is controlled.

The pre-converter circuit PCC operates in a conventional manner, with energy being periodically stored in energy-storing inductor ESI and periodically dumped into energy-storing capacitor ESC—all being effectuated by switching transistor FET ON/OFF in a controlled and well known manner.

For the pre-converter circuit to operate properly, the absolute magnitude of the B+ voltage (i.e., the DC supply voltage present between the B− bus and the B+ bus) must be substantially higher than the absolute peak magnitude of the power line voltage provided from source C.

The controller means, which mainly includes a conventional pre-converter IC (such as Motorola's MC34261), functions in such manner that when the magnitude of the control voltage provided at control input terminal CIT3 exceeds a certain pre-determined level, the drive signal provided to the gate of transistor FET—which signal is normally provided from control output terminal COT1—ceases to be provided; which means that no further energy will be pumped into energy-storing capacitor ESC. As the magnitude of the control voltage decreases below this pre-determined level, drive signal will again be provided, and energy will again be pumped into capacitor ESC—with the amount of energy pumped being proportional (up to a point) to the degree by which the magnitude of the control signal is lower than the pre-determined level.

Thus, at a given amount of power being drawn by the ballast circuit connected with the DC supply voltage, to maintain the magnitude of this DC supply voltage at a constant level, the magnitude of the control voltage provided to terminal CIT3 will have to be a certain small amount lower than the pre-determined level.

By providing to terminal CIT3 a control voltage of magnitude proportional to that of the DC supply voltage, the magnitude of the DC supply voltage will keep increasing until reaching a magnitude that causes the control voltage to attain the particular magnitude that corresponds to the magnitude of the DC supply voltage.

Thus, in the circuit arrangement of FIG. 13, with no current flowing in the fluorescent lamps, by way of the voltage divider consisting of resistors R4 and R3 (neglecting the effect of resistor R5), the magnitude of the DC supply voltage will be determined be the R4/R3 ratio.

Using a typical pre-converter IC (such as Motorola's MC34261) in controller means CM, the magnitude of the control voltage at terminal CIT3 needs to be about 2.5 Volt before the control output signal ceases to be provided to the gate of transistor FET; which means that, if the desired magnitude of the DC supply voltage be 400 Volt, the R4/R3 ratio must be 160.

The magnitude of the lamp current delivered to lamps FL1 and FL2 is approximately proportional to the magnitude of the DC supply voltage. Thus, by controlling the magnitude of the DC supply voltage, the magnitude of the lamp current can be controlled.

Conversely, by using a measure for the magnitude of the lamp current to control the magnitude of the DC supply voltage, the magnitude of the lamp current can be controlled.

In particular, in the circuit arrangement of FIG. 13, with no lamp current flowing, the magnitude of the DC supply voltage—which is now solely determined by the feedback provided from the DC supply voltage by way of the R4/R3 voltage divider—will be at a certain higher level. However, when lamp current is flowing, a positive voltage will develop at the cathode of diode D1; which positive voltage will cause the magnitude of the control voltage at terminal CIT3 to be higher than it would be otherwise. Thus, with lamp current flowing, the pre-converter circuit will regulate the magnitude of the DC supply voltage to a certain lower level that when lamp current is not flowing.

By arranging for the magnitude of the lamp current to be higher than desired when the ballast inverter is powered with a DC supply voltage at said certain higher level, and by properly adjusting the values of the magnitude of the DC voltage developing at the cathode of diode D1, as soon as lamp current starts flowing, the magnitude of the DC supply voltage will—by negative feedback action—be reduced to the point where the magnitude of the lamp current is at the desired level.

In particular, the various components are selected and adjusted such that at any lamp current of magnitude higher than the desired level, the magnitude of the voltage developing at the cathode of diode D1 is sufficiently high to cause the pre-converter circuit to reduce the flow of power to energy-storing capacitor ESC; which, in turn, will have the effect of reducing the magnitude of the DC supply voltage; which, in turn, will reduce the magnitude of the lamp current; etc.

Thus, when unloaded, the circuit arrangement of FIG. 13 regulates the magnitude of the DC supply voltage to some desired no-load voltage level. When loaded, the circuit arrangement of FIG. 13 regulates the magnitude of the output current to some desired load current level by way of automatically reducing the magnitude of the DC supply voltage to be lower than said desired no-load voltage level. For this control arrangement to work, it is necessary that the load current level resulting when the magnitude of the DC supply voltage is at the desired no-load voltage level be higher than said desired load current level.

Yet Additional Comments (v) A basic element of the present invention relates to using the pre-converter circuit for regulating not only the magnitude of the DC supply voltage, but also some other parameter, such as the magnitude of an output current or voltage.

For this concept to apply, it is desirable that—in the absence of feedback—the magnitude of the resulting DC supply voltage will keep on increasing to some very high value. Then by application of negative feedback control, this magnitude can be cut back to any one of several potentially desirable levels. However, it is necessary that these multiple levels not conflict with each other; which is why it is necessary that the no-load DC supply voltage be regulated to a level that is higher than the DC supply voltage level that results when loading is at a desired level.

In other words, by way of the pre-converter circuit, the magnitude of the DC voltage can be controlled to prevent any one of several variables from exceeding some given level.

For instance, with reference to the transient voltages depicted in FIG. 11H, by appropriate feedback, the magnitude of these transient voltages can be prevented from exceeding some pre-determined level.

(w) With respect to the ballast arrangement of FIG. 13, a main purpose for controlling the magnitude of the lamp current is that of compensating for possible inaccuracies in the parameters of the various components in the ballast circuit (including the lamps), thereby—for mass production purposes—not having to specify the parameters of the components with accuracies as high as otherwise necessary.

(x) In the circuit arrangement of FIG. 13, it is possible by simple means to use the very presence of lamp current to de-activate the feedback provided to control input terminal CIT3 from the B+ voltage, in which case it be possible to control the magnitude of the lamp current in a more flexible manner.

For instance, with no lamp current flowing, the magnitude of the DC supply voltage could be regulated to a given substantially constant level (regardless of variations in the magnitude of the power line voltage supplied from source S); yet, after lamp current starts to flow, the magnitude of this lamp current could now be increase or decreased from the level associated with this given level.

In other words, prior to lamp ignition, the magnitude of the DC supply voltage may be regulated to a magnitude such as to provide for a lamp ignition voltage of proper magnitude; whereas, after lamp ignition, the magnitude of the DC supply voltage may (in total independence of the prior regulation of the pre-ignition DC voltage magnitude) be controlled so as to achieve a lamp current of a particular desired magnitude.

(y) Within a limited degree, the magnitude of the DC supply voltage may be controlled so as to attain a dimming function; in which case, a dimmed level of light output may be attained without thereby (in the dimmed position) compromising the ballast's ability to ignite the gas discharge lamp.

DESCRIPTION OF A FIFTH CIRCUIT EMBODIMENT

Details of Construction of Fifth Circuit Embodiment

Figure 14:
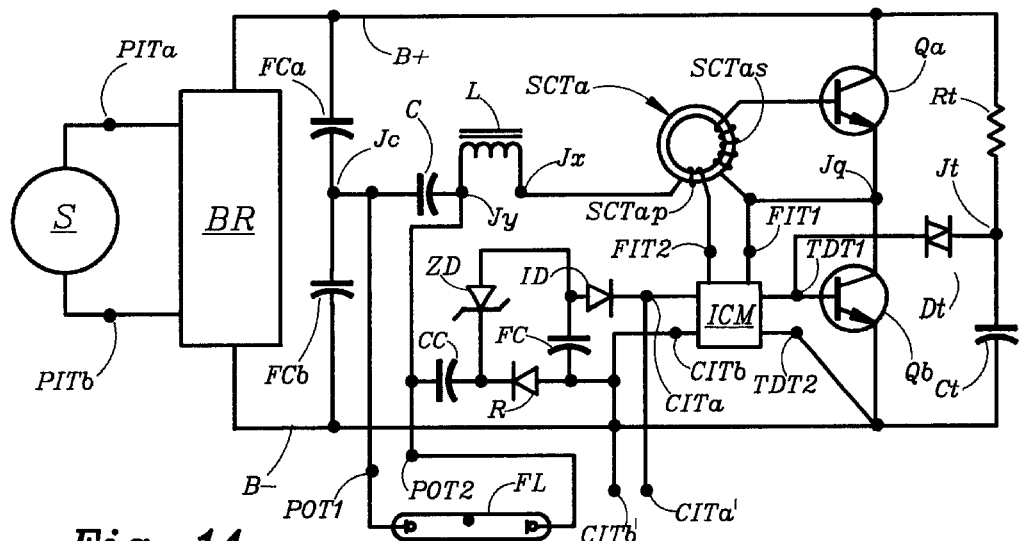
FIG. 14 illustrates a half-bridge inverter-type ballast characterized by having a 30–40 kHz squarewave inverter output voltage with controllable waveform symmetry.

FIG. 14 schematically illustrates the electrical circuit arrangement of a fifth circuit embodiment.

In FIG. 1, a source S of ordinary 120 Volt/60 Hz power line voltage is applied to power input terminals PITa and PITb; which terminals, in turn, are connected with a bridge rectifier BR. The DC output from bridge rectifier BR is applied to a B+ bus and a B− bus, with the B+ bus being of positive polarity.

A first filter capacitor FCa is connected between the B+ bus and a junction Jc; and a second filter capacitor FCb is connected between junction Jc and the B− bus.

A first switching transistor Qa is connected with its collector to the B+ bus and with its emitter to a junction Jq.

A second switching transistor Qb is connected with its collector to junction Jq and with its emitter to the B− bus.

An inverter control means ICM has a pair of feedback input terminals FIT1 and FIT2, a pair of transistor drive terminals TDT1 and TDT2, and a pair of control input terminals CITa and CITb.

Input terminals FIT1 and FIT2 are series-connected with the primary winding SCTap of a saturable current transformer SCTa to form a series-combination, and this series-combination is connected between junction Jq and a junction Jx. Secondary winding SCTas is connected across the base-emitter junction of transistor Qa. Transistor drive terminals TDT1 and TDT2 are respectively connected with the base and the emitter of transistor Qb; and control input terminals CITb and CITa are respectively connected with the B− bus the cathode of an isolating diode ID. Control input terminals CITa and CITb are respectively connected with terminals CITa' and CITb'.

The anode of isolating diode ID is connected with the anode of a Zener diode ZD; whose cathode is connected with the cathode of a rectifier R; whose anode is connected with the B− bus. A filter capacitor FC is connected between the anode of Zener diode ZD and the B− bus; and a coupling capacitor CC is connected between a junction Jy and the cathode of rectifier R.

A capacitor C is connected between junction Jc and junction Jy; and an inductor L is connected between junctions Jy and Jx. Junctions Jc and Jy are respectively connected with power output terminals POT1 and POT2; across which output terminals is connected a fluorescent lamp FL.

A resistor Rt is connected between the B+ bus and a junction Jt; a capacitor Ct is connected between junction Jt and the B− bus; and a Diac Dt is connected between junction Jt and the base of transistor Qb.

Figure 15:
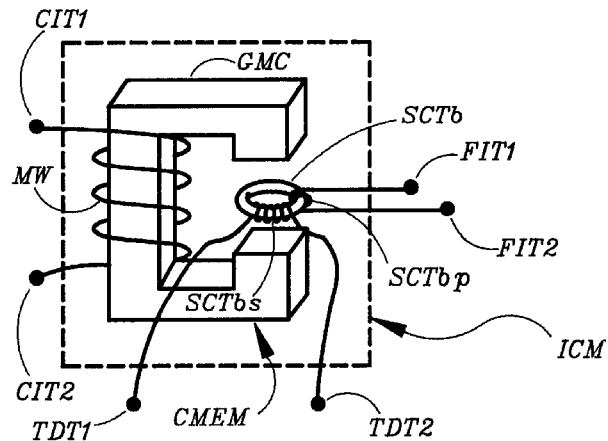
FIG. 15 illustrates an inverter control means used in the inverter arrangement of FIG. 14.

FIG. 15 provides details of inverter control means ICM.

In FIG. 15, a saturable current transformer SCTb has: i) a primary winding SCTbp connected between feedback input terminals FIT1 and FIT2, and ii) a secondary winding SCTbs connected between transistor drive terminals TDT1 and TDT2.

A cross-magnetizing electro-magnet CMEM has a gapped magnetic core GMC; and saturable current transformer SCTb is positioned within the gap thereof.

Gapped magnetic core GMC has a magnetizing winding MW, the terminals of which are connected between control input terminals CIT1 and CIT2.

Figure 16:
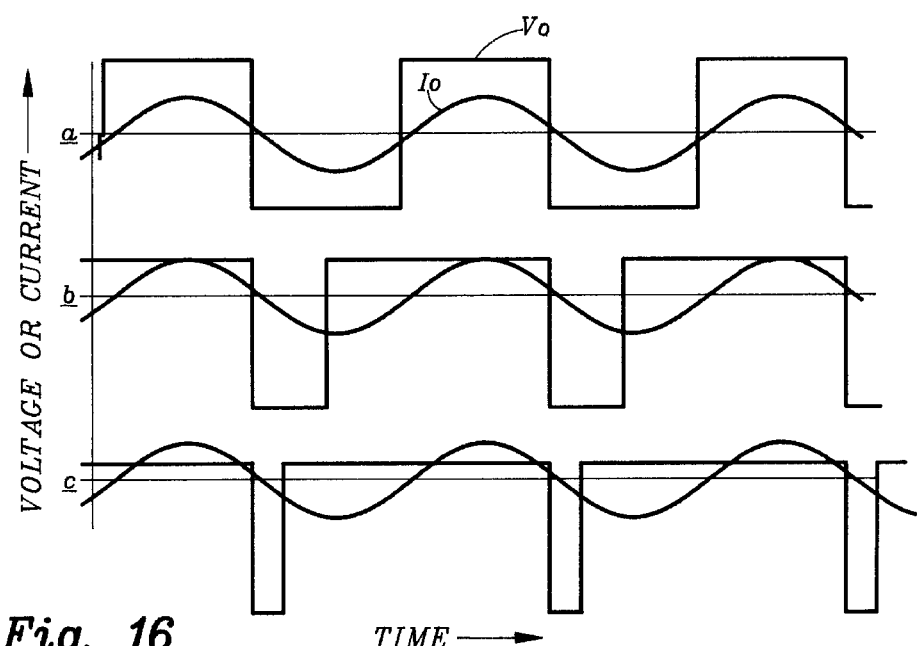
FIG. 16 illustrates various typical voltage and current waveforms associated with the operation of the circuit arrangement of FIG. 14.

FIG. 16 shows various voltage and current waveforms related to the operation of the circuit of FIG. 14.

Waveform a in FIG. 16 shows the inverter's output voltage Vo as it exists between junctions Jc and Jx for a situation where there is no cross-magnetization of saturable current transformer SCTb. The corresponding inverter output current is shown as Io.

Waveforms b and c, respectively, show the inverter's output voltage Vo as it exists between junctions Jc and Jx for situations with a medium amount and a large amount of cross-magnetization of saturable current transformer SCTb. The corresponding inverter output currents are indicated as Io.

Details of Operation of Fifth Circuit Embodiment

Except for the cross-magnetizing means, the operation of the half-bridge inverter of FIG. 14 is quite conventional and is explained in conjunction with FIG. 8 of U.S. Pat. No. Re. 31,758 to Nilssen.

For a given magnitude of the DC supply voltage and for a given basic inverter oscillation frequency, the magnitude of the current provided to the load (FL) is a sensitive function of the waveshape of the inverter's squarewave output voltage. Basically, the larger the magnitude of the fundamental frequency component, the higher the power provided to the load.

The basic inverter oscillating frequency is about 30 kHz; and is principally determined by the longer of the forward conduction times (ON-times) of the two inverter transistors (Qa and Qb). As indicated by waveform a in FIG. 3, without any cross-magnetizing flux applied to the lower saturable current transformer (SCTb), the ON-times are both about the same: about 16 micro-seconds. However, as cross-magnetization is applied, the ON-time of the lower transistor shortens. Waveform b indicates the shortened ON-time of the lower transistor for a medium amount of cross-magnetization; and waveform c indicates the even more shortened ON-time for a relatively large amount of cross-magnetization.

The ON-time of the upper transistor is that length of time when the instantaneous magnitude of the inverter's output voltage Vo is positive while at the same time the inverter's output current Io is also positive; the ON-time of the lower transistor is that length of time when the instantaneous magnitude of the inverter's output voltage Vo is negative while at the same time the inverter's output current Io is also negative.

During other times, the inverter's output current is flowing through each transistor in the reverse direction. For instance, with respect to transistor Qa, after its associated saturable current transformer has reached saturation, reverse current may freely flow from the emitter, through the secondary winding of the saturated transformer SCTa, into the base, and out of the collector.

Details in respect to the effect of the magnetic flux saturation characteristics on a transistor's ON-time (or on the inverter's basic oscillation frequency) are provided in U.S. Pat. No. 4,513,364 to Nilssen.

Specifically, as the saturation flux density of the saturable current transformer is reduced, the associated transistor's ON-time decreases (and, in case of a symmetrical situation, the inverter's basic oscillation frequency increases).

One way of reducing the transformer's saturation flux density is that of increasing the temperature of the ferrite magnetic core used in that transformer; which effect is further explained in U.S. Pat. No. 4,513,364 to Nilssen.

Another way of reducing the transformer's saturation flux density is that of subjecting the transformer's ferrite magnetic core to a cross-magnetizing flux, such as from an adjacently placed permanent magnet or electro-magnet. That way, the saturation flux density of the transformer's ferrite magnetic core decreases with increasing cross-magnetizing flux.

Thus, in view of FIGS. 14 and 15, as long as the L-C circuit is substantially series-resonant at the inverter's oscillation frequency whenever there is no cross-magnetization of the saturable feedback current transformer SCTb, it is clear that: i) the higher be the magnitude of the current provided to control input terminals CITa/CITb, ii) the higher be the resulting cross-magnetizing field produced by the electromagnet, iii) the more reduction there be in the saturation flux density of the current transformer's ferrite magnetic core, iv) the shorter be the ON-time of the lower transistor (Qb), v) the lower be the effective magnitude of the squarewave voltage provided from the inverter's output terminals Jc and Jx; and vi) the lower be the magnitude of the current provided to the load.

In other words: the more current be provided to control input terminals CITa/CITb: i) with the fluorescent lamp non-connected and/or inoperative, the lower be the magnitude of the voltage developing across tank-capacitor C; or ii) with the fluorescent lamp connected and operative, the lower be the magnitude of the current provided to the fluorescent lamp.

By providing for a negative feedback arrangement, the circuit of FIG. 14 provides manifest protection against excessive voltages developing across tank capacitor C.

More particularly, the magnitude of the current provided to the control input terminals CITa/CITb is a sharply non-linear function of the magnitude of the high-frequency voltage present at terminals Jc/Jy.

Then, as soon as the peak magnitude of this high-frequency voltage exceeds a predetermined level, current starts flowing through Zener diode ZD and into control input terminals CIT1/CIT2, thereby flowing through magnetizing winding MW of gapped magnetic core GMC, thereby cross-magnetizing saturable current transformer SCT, thereby decreasing the ON-time of the lower transistor, thereby causing a reduction in the effective magnitude of the inverter's output voltage, thereby causing the magnitude of the high-frequency voltage present across terminals Jc/Jy to assume a value that is substantially lower than that which otherwise would have been the case (or, conversely, causing a reduction in the magnitude of the high-frequency current flowing into the load).

The Zener voltage is chosen to be about equal to the peak-to-peak magnitude of the high-frequency voltage required to properly ignite fluorescent lamp FL; which implies that the ON-time of the lower transistor (Qb) will automatically be controlled (increased) just enough to limit the magnitude of the high-frequency voltage between junctions Jc and Jy to be no higher than that required for properly igniting the fluorescent lamp.

As soon as the fluorescent lamp ignites, the magnitude of the high-frequency voltage decreases by a substantial factor, thereby ensuring that no current will be provided to control input terminals CIT1/CIT2 as long as the lamp is indeed in normal operation. That is, the very act of lamp ignition will cause the magnitude of the high-frequency voltage to decrease below the level required to effect conduction of the Zener diode.

Whenever desired, during actual lamp operation, controllable lamp dimming may be effected by providing a control current of adjustable magnitude directly into control input terminals CITa and CITb.

DESCRIPTION OF A SIXTH CIRCUIT EMBODIMENT

Details of Construction of Sixth Circuit Embodiment

Figure 17:
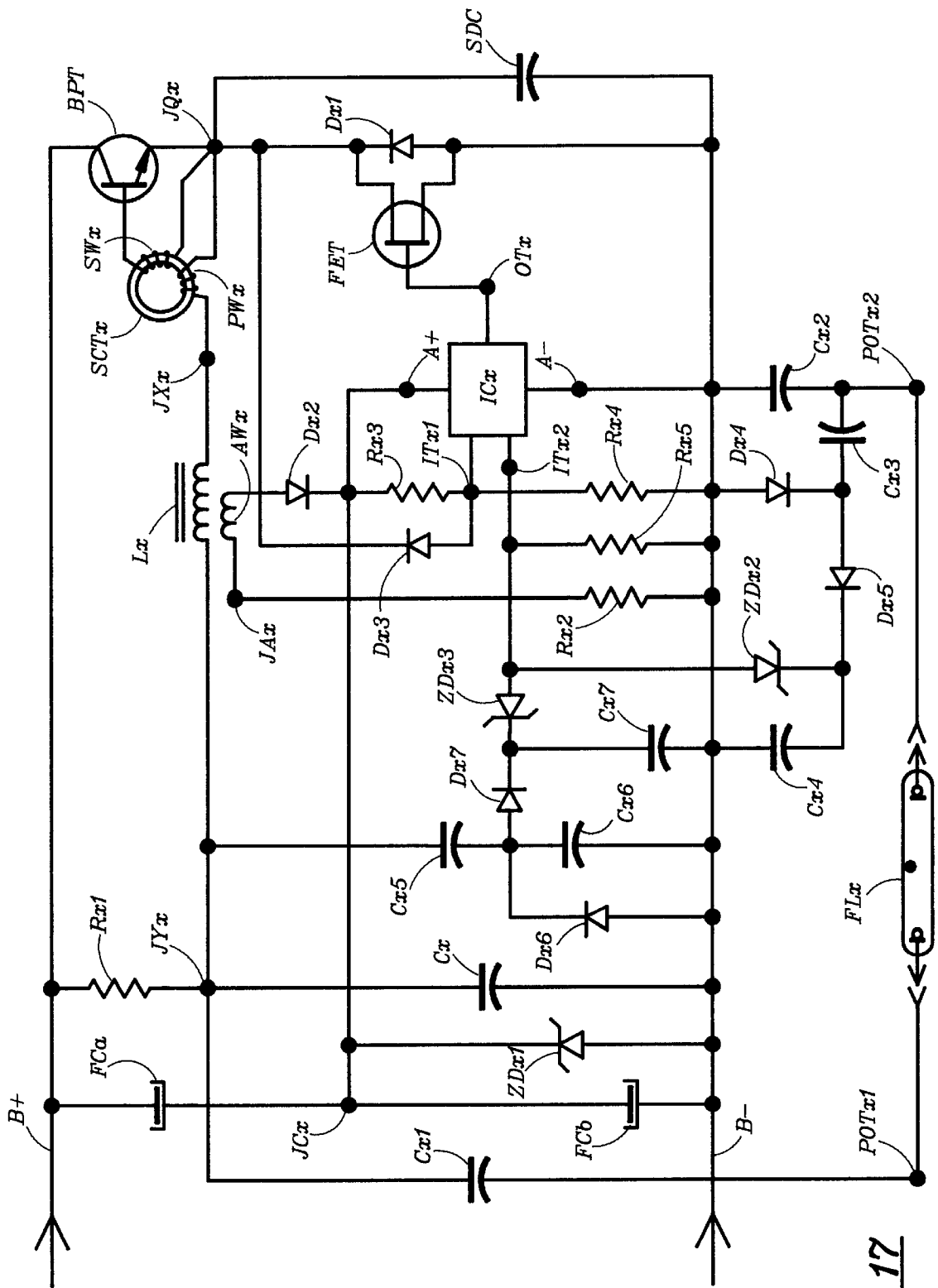
FIG. 17 illustrates a half-bridge inverter-type ballast having an inverter with control means operative to provide for improved control of waveform symmetry.

FIG. 17 schematically illustrates the sixth circuit embodiment of the invention.

In FIG. 17, details of the DC power supply circuitry have been eliminated; and the inverter ballast circuit per se is shown to be provided with a DC voltage between the B– bus and the B+ bus. A first filter capacitor FCa is connected between a junction JCx and the B+ bus; a second filter capacitor FCb is connected between junction JCx and the B– bus; and a Zener diode ZDx1 is connected between junction JCx and the B– bus, with its cathode connected with junction JCx.

A bipolar transistor BPT is connected with its collector to the B+ bus and with its emitter to a junction JQx; a field effect transistor FET is connected with its drain to junction JQx and with its source to the B– bus; a diode Dx1 is connected across the FET's source and drain, with the anode connected to the source; and a slow-down capacitor SDC is connected between junction JQx and the B– bus. A saturable current transformer SCTx has a primary winding PWx connected between junction JQx and a junction JXx, as well as a secondary winding SWx connected between the base and the emitter of transistor BPT.

A tank inductor Lx is connected between junction JXx and a junction JYx; and a tank capacitor Cx is connected between junction JYx and the B– bus. A resistor Rx1 is connected between junction JYx and the B+ bus. A capacitor Cx1 is connected between junction JYx and a first power output terminal POTx1; a capacitor Cx2 is connected between the B– bus and a second power output terminal POTx2; and a fluorescent lamp FLx is disconnectably connected between power output terminals POTx1 and POTx2.

An auxiliary winding AWx, which is coupled with tank inductor Lx, has its terminals connected between a junction JAx and the anode of a diode Dx2, whose cathode is connected with junction JCx. A resistor Rx2 is connected between junction JAx and the B– bus.

Junction JCx is connected with the A+ terminal (i.e., the positive DC supply terminal) of an integrated circuit ICx, whose A– terminal (or negative DC supply terminal) is connected with the B– bus. A resistor Rx3 is connected between the A+ terminal and a first input terminal ITx1 of integrated circuit ICx; and a resistor Rx4 is connected between input terminal ITx1 and the B– bus. A diode Dx3 is connected with its anode to first input terminal ITx1 and with its cathode to the drain of field effect transistor FET. An output terminal OTx of integrated circuit ICx is connected with the gate terminal of field effect transistor FET.

A capacitor Cx3 is connected between output terminal POTx2 and the cathode of a diode Dx4, whose anode is connected with the B– bus. A diode Dx5 is connected with its anode to the cathode of diode Dx4 and with its cathode to the cathode of a Zener diode ZDx2, whose anode is connected with an input terminal ITx2 of integrated circuit IC. A capacitor Cx4 is connected between the cathode of diode Dx5 and the B– bus; and a resistor Rx5 is connected between input terminal ITx2 and the B– bus.

A capacitor Cx5 is connected between junction JYx and the cathode of a diode Dx6, whose anode is connected with the B– bus; a capacitor Cx6 is connected between the cathode of diode Dx6 and the B– bus; and a diode Dx7 is connected with its anode to the cathode of diode Dx6 and with its cathode to the cathode of a Zener diode ZDx3, whose anode is connected with input terminal ITx2 of integrated circuit ICx. A capacitor Cx7 is connected between the cathode of diode Dx7 and the B– bus.

Details of Operation of Sixth Circuit Embodiment

Figure 18:
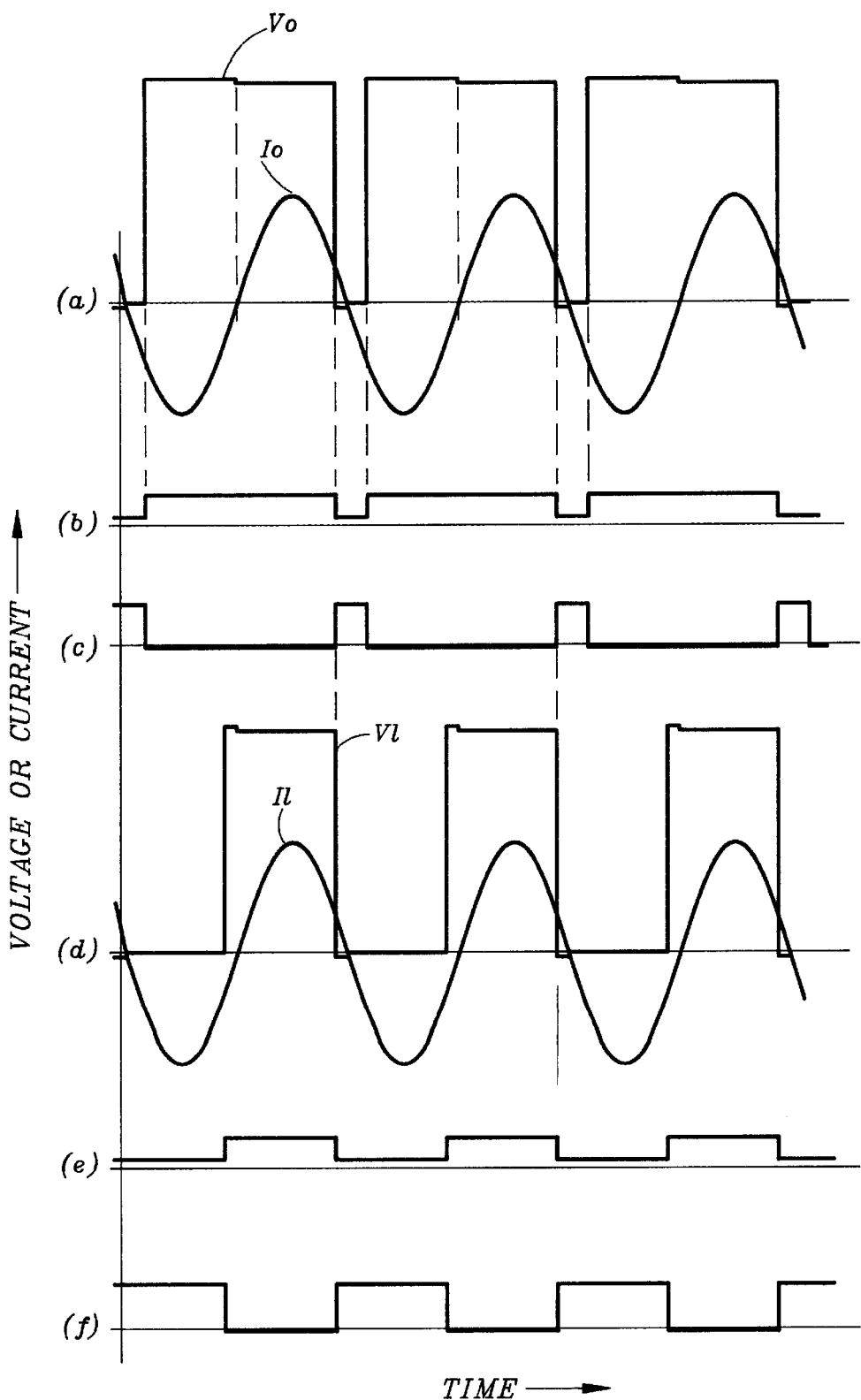
FIG. 18 illustrates various typical voltage and current waveforms associated with the circuit arrangement of FIG. 17.

FIG. 18 illustrates some of the voltage and current waveforms associated with the operation of the sixth circuit embodiment of FIG. 17.

In FIG. 18, as referenced to the B– bus: (a) shows the waveform Vo of the voltage existing at the FET's drain prior to lamp ignition; (b) shows the waveform of the voltage existing at input terminal ITx1 prior to lamp ignition; (c) shows the waveform of the voltage existing at the FET's gate prior to lamp ignition; (d) shows the waveform of the voltage V1 of the voltage existing at the FET's drain after lamp ignition; (e) shows the waveform of the voltage existing at input terminal ITx1 after lamp ignition; and (f) shows the waveform of the voltage existing at the FET's gate after lamp ignition.

Also, in FIG. 18: (a) shows the waveform of the current Io flowing through inductor Lx prior to lamp ignition, and (d) shows the waveform of the current I1 flowing through inductor Lx after lamp ignition.

The operation of the circuit of FIG. 17 is substantially the same as that of the circuit of FIG. 14, except for the action of integrated circuit ICx.

In the circuit of FIG. 17, integrated circuit ICx is in effect a triggerable one-shot which times out after a certain pre-determined maximum period, except when provided with a positive-polarity control current (or voltage) at input terminal IPx2, in which case it times out within a period shorter than this certain pre-determined maximum period: the higher the magnitude of the control current, the shorter period for timing out.

The certain pre-determined maximum period is about equal to the period required for saturable current transformer SCTx to time out (i.e., to reach saturation after having been fully reset); which is typically about 12 micro-seconds for a situation when the inverter's output voltage has a fundamental frequency of about 30 kHz.

Like the circuit of FIG. 14, the circuit of FIG. 17 has to be triggered into operation; which triggering may be accomplished in substantially the same manner as that shown in FIG. 14.

In the circuit of FIG. 17, prior to lamp ignition (or with the lamp FLx disconnected), the voltage present at the FET's drain terminal will be as shown in FIG. 18 by the waveform identified as Vo in line (a).

The waveform Vo results from self-oscillating interaction between bipolar transistor BPT and field effect transistor FET; which interaction is caused by saturable current transformer SCTx acting on transistor BPT; which, in turn, acts on integrated circuit ICx, which then acts on transistor FET.

In particular and in part, with a positive voltage of about 15 Volt applied to the A+ terminal of integrated circuit ICx, a positive voltage (of about 6 Volt magnitude) will also be applied to input terminal IPx1. With such a positive voltage applied to input terminal IPx1, integrated circuit ICx functions such as to cause the magnitude of the voltage provided from output terminal OTx to the FET's gate to be so low as to maintain the FET in a non-conductive state. However, whenever the magnitude of the voltage at the FET's drain falls to a sufficiently low level, by action of diode Dx3, the magnitude of the positive voltage at input terminal ITx1 will be reduced to a point where it becomes so low to cause the magnitude of the voltage provided at output terminal OTx abrubtly to increase to a point where the FET is brought into a state of being conductive. Starting at the point in time when the FET is rendered conductive, by way of ordinary one-shot action, integrated circuit ICx now starts a timing cycle whereby, after a maximum predetermined period (e.g., about 12 micro-seconds), it reverses its state, thereby to render the FET non-conductive again.

More particularly and completely, the operation occurs as follows.

Briefly after saturable transformer SCTx saturates (with forward current still flowing through it), transistor BPT abruptly ceases to conduct. Yet, the current flowing through inductor Lx at that point will continue to flow; but, since it can no longer flow through transistor BPT, it must now flow into capacitor SDC. As a result, the voltage at junction JQx—which, just prior to the turn-off of transistor BPT, was at the potential of the B+ bus—will now rapidly fall to the point where it becomes clamped (via diode Dx1) at the potential of the B− bus. Thereafter, the current will continue to flow from inductor Lx (through diode Dx1) until the energy stored therein has been discharged (into the inverter's power supply).

However, the very fact that the magnitude of the voltage on the FET's drain terminal fell to near zero, caused the magnitude of the voltage at input terminal ITx1 to fall to near zero; which therefore caused integrated circuit ICx to provide a voltage at output terminal OTx of magnitude sufficient to render the FET conductive.

As shown at line (f) of FIG. 18, with no input provided to input terminal ITx2, the output from output terminal OTx will be such as to cause the FET to remain conductive for a given duration (e.g., 12 micro-seconds), thereby to cause the inverter's output voltage (i.e., the voltage at junction JQx with reference to the B− bus) to be as shown by waveform V1 in line (d) of FIG. 18. The waveform of the voltage at input terminal ITx1 will be as shown at line (e) of FIG. 18.

As shown at line (c) of FIG. 18, with a certain amount of current provided to input terminal ITx2—such as will be provided via Zener diode ZDx3 in case the magnitude of the voltage at junction JYx were to exceed a pre-determined level—the output from output terminal OTx will be such as to cause the FET to remain conductive for a length of time shorter than said given duration, thereby to cause the inverter's output voltage (i.e., the voltage at junction JQx with reference to the B− bus) to be as shown by waveform Vo in line (a) of FIG. 18. The waveform of the voltage at input terminal ITx1 will be as shown at line (b) of FIG. 18.

The waveforms depicted at lines (a), (b) and (c) of FIG. 18 correspond approximately to the situation existing prior to lamp LFx having ignited (or with the lamp being disconnected); while the waveforms depicted at lines (d), (e) and (f) of FIG. 18 correspond approximately to the situation existing after lamp FLx has ignited and draws a maximum amount of power.

For situations where lamp FLx draws less than the maximum amount of power, such as in a dimmed mode (which is attainable by lowering the resistance value of resistor Rx5), the various voltages will have waveforms intermediary of those of FIG. 18.

On power-up, the A+ voltage required for powering integrated circuit ICx is attained via a voltage-dividing method whereby filter capacitor FCb gets charged to a suitable voltage (e.g., about 15 Volt) by way of the charging current flowing through filter capacitor FCa. (Zener diode ZDx1 prevents excessive voltage build-up on filter capacitor FCb.) After initial power-up, continuous power for integrated circuit ICx is provided by way of auxiliary winding AWx and rectifier Dx2, using filter capacitor FCb for filtering.

Additional Comments re Embodiments of FIGS. 14–18

(aa) Detailed information relative to a fluorescent lamp ballast wherein the fluorescent lamp is powered by way of a series-excited parallel-loaded L-C resonant circuit is provided in U.S. Pat. No. 4,554,487 to Nilssen.

One effect of such a ballasting arrangement is that of making the waveshape of the voltage provided across the output to the fluorescent lamps very nearly sinusoidal, even though the output from the inverter itself, at the input to the series-resonant L-C circuit, is more-or-less of squarewave shape.

(ab) The circuit arrangements of FIG. 14 is applicable to various loads and for various reasons. For instance, regardless of the type of load used, the control arrangement disclosed can be used to regulate power output against variations in the magnitude of the power line voltage. Or, in case of the load being a rectifier means and a storage battery requiring to be charged, the ON-time control means can be used to provide the required tapering of the charging current. In situations where an inverter is loaded with a series-resonant parallel-loaded L-C circuit, the control means provided prevents the magnitude of the high-frequency voltage developing across the tank-capacitor of the L-C circuit from reaching destructive levels.

(ac) Saturable current transformer SCT requires only a miniscule Volt-Ampere input and the voltage-drop across its primary winding is only a small fraction of one Volt. Hence, the magnitude of the voltage-drop between junctions Jq and Jx is substantially negligible, and the inverter's output voltage is therefore effectively provided between junctions Jx and Jc; which means that the inverter's full output voltage is provided across the series L-C circuit.

(ad) To improve loop-gain in the control arrangement, thereby to attain increased control sensitivity, control current to control input terminals CIT1/CIT2 can be drawn from the DC supply voltage by way of a transistor—with the transistor base being controlled with current as provided either: i) in response to the magnitude of the high-frequency voltage present between junctions Jc and Jy, by way of the excess-voltage-magnitude-sensing circuit comprised of elements CC, R, ZD, FC and ID; or ii) in response to the magnitude of an externally provided control signal.

(ae) The current waveforms (Io) illustrated in FIG. 16 are not drawn to vertical scale. Rather, they are drawn mainly to indicate the phase relationship between the inverter's output voltage and the inverter's output current. In reality, other things being equal, the magnitude of the current in FIG. 16a would be of larger magnitude than that of FIG. 16b; which, in turn, would be of larger magnitude than that of FIG. 16c.

(af) With reference to the ballast circuit of FIG. 17, in a typical situation, the magnitude of the DC voltage between the B− bus and the B+ bus might be about 300 Volt; which means that filter capacitor FCa should have a voltage rating of at least 285 Volt, provided the Zenering voltage of Zener diode ZDx1 is 15 Volt and that filter capacitor FCb operates with a DC voltage of about 15 Volt across its terminals.

(ag) In the ballast circuit of FIG. 17, the magnitude of the 30 kHz voltage present across capacitor Cx2 represents a measure of the magnitude of the 30 kHz current flowing through capacitor Cx2; which, of course, is the same current that flows through fluorescent lamp FLx. Thus, by way of capacitor Cx3 and diodes Dx4/Dx5, the magnitude of the DC voltage developing across capacitor Cx4 is a measure of the magnitude of the 30 kHz current flowing through lamp FLx. Whenever this DC voltage exceeds some desired pre-determined level, current starts flowing through Zener diode ZDx2, thereby to cause the duration of the positive pulse provided from output terminal OTx to shorten; thereby, in turn, to cause the magnitude of the lamp current to be regulated so as to prevent the magnitude of the DC voltage from far exceeding this pre-determined level; thereby correspondingly to prevent the magnitude of the lamp current from far exceeding the desired pre-determined level.

Similarly, the magnitude of the 30 kHz voltage developing across capacitor Cx6 is a measure of the magnitude of the 30 kHz current flowing through it; the magnitude of which current, in turn, is a measure of the magnitude of the 30 kHz voltage present at junction JYx. Thus, via elements Dx6/Dx7 and ZDx3, a DC voltage developing across capacitor Cx7, the magnitude of which DC voltage is a measure of the magnitude of the 30 kHz voltage present at junction JYx; and, whenever the magnitude of this DC voltage exceeds some pre-determined level, current starts flowing through Zener diode ZDx3, thereby to cause the duration of the positive pulse provided from output terminal OTx to shorten; thereby, in turn, to cause the magnitude of the 30 kHz voltage at junction JYx to be regulated so as to prevent the magnitude of the DC voltage across capacitor Cx7 from far exceeding this pre-determined level; which, of course, means that the magnitude of the 30 kHz voltage at junction JYx will be prevented from far exceeding some pre-determined level.

(ah) In FIG. 18, although the frequency of the waveforms shown at lines (a)–(c) is indicated as being the same as the frequency of the waveforms shown at lines (d)–(f), the frequency of the waveforms of lines (a)–(c) is actually somewhat higher than those of lines (d)–(f).

That is, when the ON-time of transistor FET is reduced compared with the ON-time of transistor PBT, the net result is a not only the indicated reduction in symmetry of the inverter's AC output voltage but is also an increase in the fundamental frequency of this AC output voltage; both of which effects helps in the control of the magnitude of the AC voltage at junction JYx or in the control of the magnitude of the lamp current.

(ai) The AC component of the inverter's output voltage—which is the AC component of the voltage present at junction JQx as referenced to the B− bus—is in fact a squarewave voltage; which is to say that it alternates abrubtly between a first substantially constant voltage level (the voltage level represented by the B− bus and a second substantially constant voltage level (the voltage level represented by the B− bus).

This squarewave voltage consists of many harmonically related voltage components. It has a fundamental voltage component at a fundamental frequency (e.g., 30 kHz) as well as several harmonically related voltage components at higher frequencies (i.e., at 60 kHz, 90 kHz, 120 kHz, etc.).

For a given peak-to-peak magnitude, as the symmetry of the squarewave voltage is controlled, the magnitude of its fundamental voltage component is correspondingly controlled: the more assymetrical the squarewave voltage, the lower the magnitude of the fundamental (i.e., 30 kHz) voltage component.

Thus, with the lamp load connected with the inverter's output by way of an L-C circuit series-resonant at or near the 30 kHz fundamental frequency of the inverter's more-or-less symmetrical squarewave output voltage, the magnitude of the 30 kHz current flowing through the series L-C circuit and therefore the magnitude of the lamp current (or, if unloaded, the magnitude of the voltage voltage, developing across the L-C circuit's tank capacitor) will be proportional to the magnitude of the 30 kHz fundamental voltage component of this squarewave voltage.

Thus, in the ballast circuit of FIG. 17, controlling the degree of assymmetry of the inverter's 30 kHz squarewave output voltage—which has a substantially constant peak-to-peak magnitude and which is applied across a series-connected L-C circuit having a natural resonance frequency at or near 30 kHz—has the effect of controlling the magnitude of the 30 kHz voltage applied across the series-connected L-C circuit.

(aj) In the ballast circuit of FIG. 17, the use of a field effect transistor as the switching transistor whose ON-time is controlled has significant advantages over the use for that purpose of a bi-polar transistor for at least three reasons: (i) its switching time is much shorter than that of a bi-polar transistor, therefore permitting the attainment of much shorter ON-times than otherwise would be feasible; (ii) control of the duration of its ON-time is easier to accomplish; and (iii) as long as the field effect transistor is positioned on the "cold" side (i.e., the "non-floating" or the the B− side) of the half-bridge inverter, its gate control circuit uses components of a type that is readily capable of being provided in the form of an IC, whose requisite power supply can readily be provided as a low-cost adjunct to the main filter capacitor of the inverter's DC power supply.

On the other hand, in a half-bridge inverter, the use of a bi-polar transistor as the "floating" switching transistor (i.e., the transistor that is not directly connected with the B− bus) whose ON-time is not controlled has significant advantages over the use for that purpose of a field effect transistor for at least three reasons: (i) its drive signal can be provided very simply by way of a saturable current transformer of miniscule size (i.e., less than 0.1 cubic-centimeter in volume) substantially without use of any auxiliary components; (ii) the requisite electrical isolation (i.e., the "floating") of its drive circuit is automatically attained at no cost by way of an isolated primary winding on this same saturable current transformer; and (iii) the cost of a bi-polar transistor is lower than that of a field effect transistor of the same effective current rating.

(ak) As a point of definition, a transistor is considered as being "ON" when it is made to be fully conductive in its regular forward manner, such as occurs when the base-emitter junction of a bi-polar transistor is supplied with forward base current. That is, an ordinary NPN bipolar transistor is considered as being "ON" whenever positive current may flow with substantially no voltage drop from the collector to the emitter; which, of course, occurs whenever a sufficient amount of positive current is supplied to its base.

However, in many field effect transistors, reverse current may flow through the transistor even if the transistor is not in its ON-state. This is so for the reason that many field effect transistors has a built-in diode (such as dioded Dx1 in FIG. 17) permitting such reverse current to flow.

In case of transistor BPT of FIG. 17, even if the transistor is not switched ON, reverse current may freely flow: not through the transistor per se, but via secondary winding SWx through the transistor's base-collector junction.

DESCRIPTION OF PREFERRED EMBODIMENTS

Details of Construction of Seventh Circuit Embodiment

Figure 19:
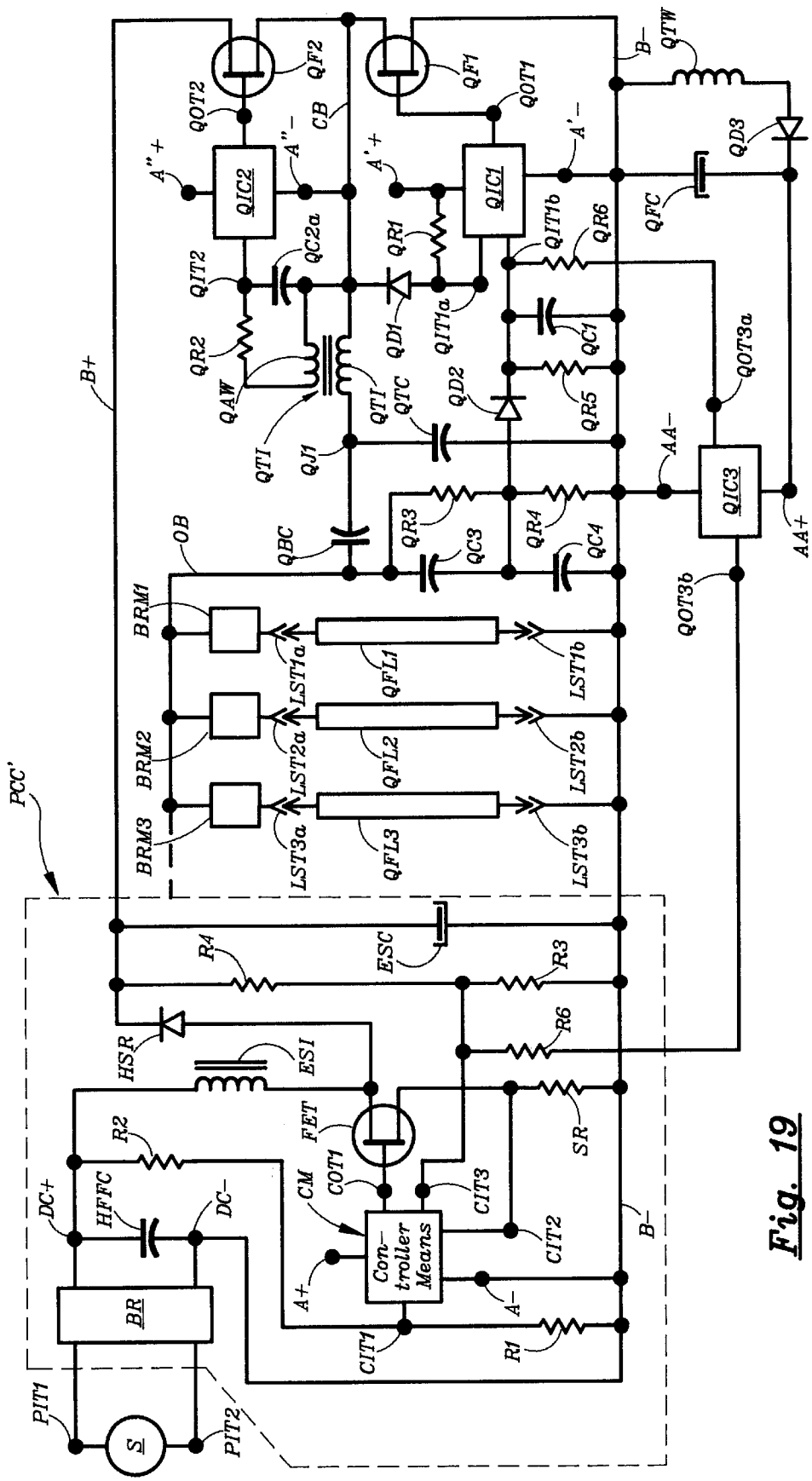
FIG. 19 illustrates a modification of the half-bridge inverter-type ballast circuit of FIG. 17 powered via a pre-converter such as used in the circuit arrangement of FIG. 13.

FIG. 19 schematically illustrates a seventh embodiment of the circuit arrangement of the invention.

In FIG. 19, filtered and regulated DC supply voltage is provided between the B− and B+ bus by pre-converter circuit PCC'; which pre-converter circuit is identical to pre-converter circuit PCC of FIG. 13, except for having removed components CT, R7, D1, C1, and R5; which components were used for the purpose of regulating lamp current magnitude. Also, for purposes of simplification, A-battery AB (or its equivalent) is not shown in FIG. 19.

Connected with the B− bus is the source terminal of a first field effect transistor QF1, whose drain terminal is connected with a center bus CB; which center bus is also connected with the source terminal of a second field effect transistor QF2, whose drain terminal is connected with the B+ bus.

A one-shot-type integrated circuit means QIC1 has an A'− terminal connected with the B− terminal and an A'+ terminal connected with the positive terminal of a first A-supply (not shown, but could be an A-battery such as AB of FIG. 13). Integrated circuit means QIC1 has: (i) a control output terminal QOT1 connected with the gate terminal of transistor QF1; (ii) a first control input terminal QIT1a connected with the anode of a diode QD1, whose cathode is connected with the drain terminal of transistor QF1; and (iii) a second control input terminal QIT1b connected with the cathode of a diode QD2. A resistor QR1 is connected between terminal QIT1a and the A'+ terminal.

An inverting type integrated circuit means QIC2 has an A"− terminal and an A"+ terminal. The A"− terminal is connected with center bus CB as well as with the negative terminal of a second A-supply (not shown, but could be an A-battery such as AB of FIG. 13), whose positive terminal is connected with the A"+ terminal. Integrated circuit QIC2 has a control output terminal QOT2 connected with the gate terminal of transistor QF2. QIC2 also has a control input terminal QIT2.

A capacitor QC2a is connected between input terminal QIT2 and center bus CB, as is also a series-combination of a resistor QR2 and an auxiliary winding QAW on a tank inductor QTI, whose terminals are connected between center bus CB and a junction QJ1. A tank capacitor QTC is connected between junction QJ1 and the B− bus.

A low frequency blocking capacitor QBC is connected between junction QJ1 and an output bus OB. A first ballasting reactor means BRM1 is connected between output bus OB and lamp socket terminal LST1a; a second ballasting reactor means BRM2 is connected between output bus OB and lamp socket terminal LST2a; and (iii) a third ballasting reactor means BRM3 is connected between output bus OB and lamp socket terminal LST3a.

A first instant-start fluorescent lamp QFL1 is connected between lamp socket terminal LST1a and a lamp socket terminal LST1b; a second instant-start fluorescent lamp QFL1 is connected between lamp socket terminal LST2a and a lamp socket terminal LST2b; and a third instant-start fluorescent lamp QFL3 is connected between lamp socket terminal LST3a and a lamp socket terminal LST3b. Lamp socket terminals LST1b, LST2b and LST3b are all connected with the B− bus.

A resistor QR3 and a capacitor QC3 are parallel-connected between output bus OB and the anode of diode QD2; and a resistor QR4 and a capacitor QC4 are parallel-connected between the B− bus and the anode of diode QD2. A capacitor QC1 is connected between the B− bus and the cathode of diode QD2 as is also a resistor QR5.

A waveform-generating integrated circuit means QIC3 has an AA− terminal and a AA+ terminal. The AA− terminal is connected with the B− bus while the AA+ terminal is connected with the cathode of a diode QD3, whose anode is connected with the B− bus by way of a tertiary winding QTW on tank inductor QTI. A filter capacitor QFC is connected between the cathode of diode QD3 and the B− bus.

Integrated circuit means QIC3 has a control output terminal QOT3a, which is connected with control input terminal QIT1b by way of a resistor QR6.

Integrated circuit means QIC3 also has a control output terminal QOT3b, which is connected with control input terminal CIT3 of Controller Means CM by way of resistor R6.

Details of Construction of Eighth Circuit Embodiment

Figure 20:
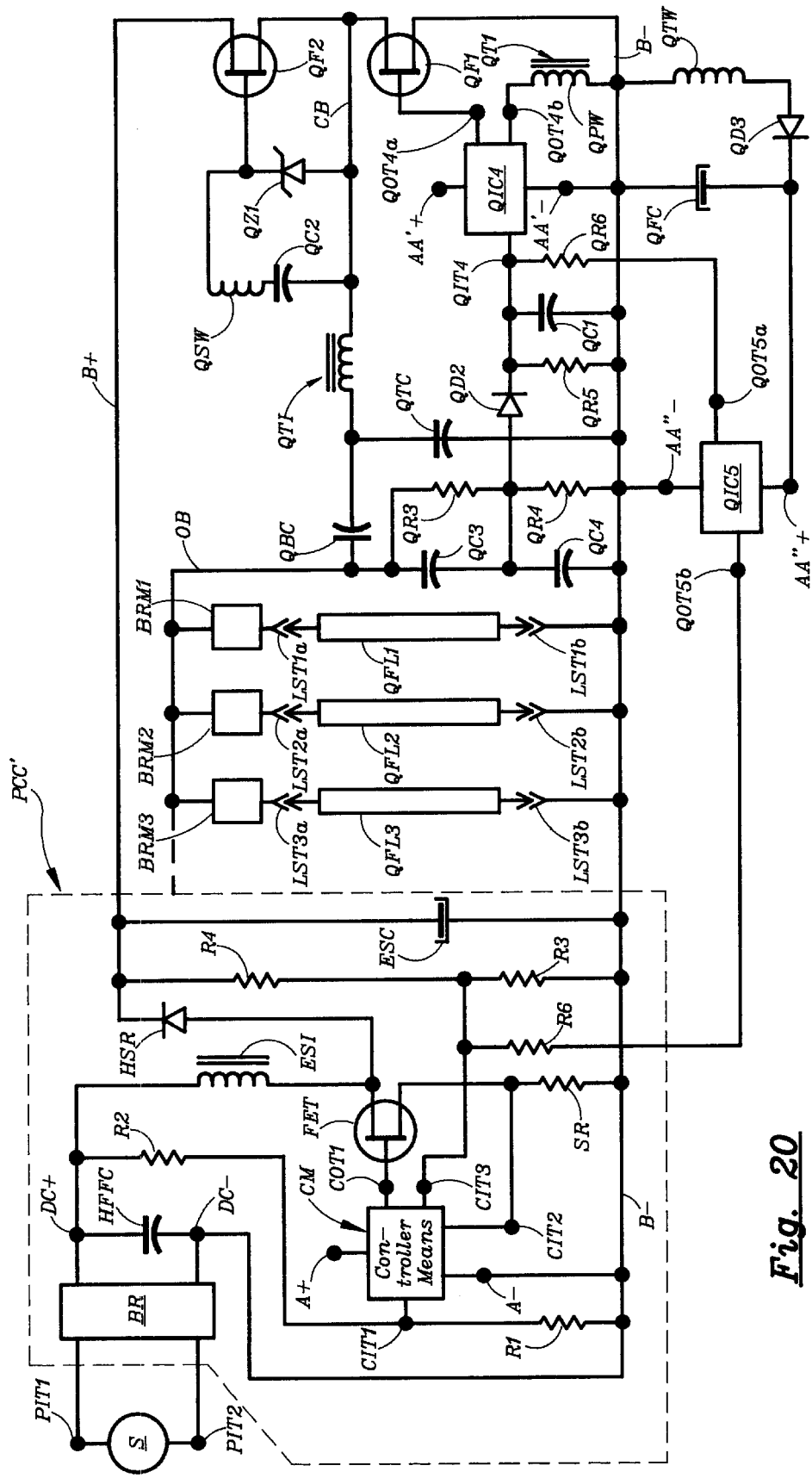
FIG. 20 illustrates a modification of the arrangment of FIG. 19.

FIG. 20 schematically illustrates an eighth embodiment of the circuit arrangement of the invention.

The arrangement of FIG. 20 is identical to that of FIG. 19 except that the following elements have been removed: QIC1 QIC2, QIC3, QD1, QR1; which elements have been replaced with the following elements: QIC4, QIC5, QT1, QC2, QZ1.

More particularly, element QIC4 is a signal generator means supplied with a DC voltage between its power input terminals AA'− and AA'+ ; terminal AA'− being connected with the B− bus; terminal AA'+ being connected with the positive terminal of an A-supply (not shown, but could be an A-battery such as AB of FIG. 13).

Signal generator means QIC4 has a first control output terminal QOT4a, which is connected with the gate terminal of transistor QF1. Signal generator means QIC4 also has a second control output terminal QOT4b, which is connected with one of two terminals of a primary winding QPW of a transformer QT1. The other terminal of primary winding QPW is connected with the B− bus.

A secondary winding QSW of transformer QT1 is connected in series with a capacitor QC2 to form a series-combination; which series-combination is connected between center bus CB and the gate terminal of transistor QF2. A Zener diode QZ1 is connected with its cathode to the gate terminal of transistor QF1 and with its anode to center bus CB.

Signal generator means QIC4 has a control input terminal QIT4, which is connected with the cathode of diode QD2.

A waveform-generating integrated circuit means QIC5 has an AA"– terminal and a AA"+ terminal. The AA"– terminal is connected with the B– bus while the AA"+ terminal is connected with the cathode of diode QD3.

Integrated circuit means QIC5 has a control output terminal QOT5a, which is connected with control input terminal QIT4 by way of resistor QR6.

Integrated circuit means QIC5 also has a control output terminal QOT5b, which is connected with control input terminal CIT3 of Controller Means CM by way of resistor R6.

Waveforms Characterizing Operation of Preferred Embodiments

Figure 21:
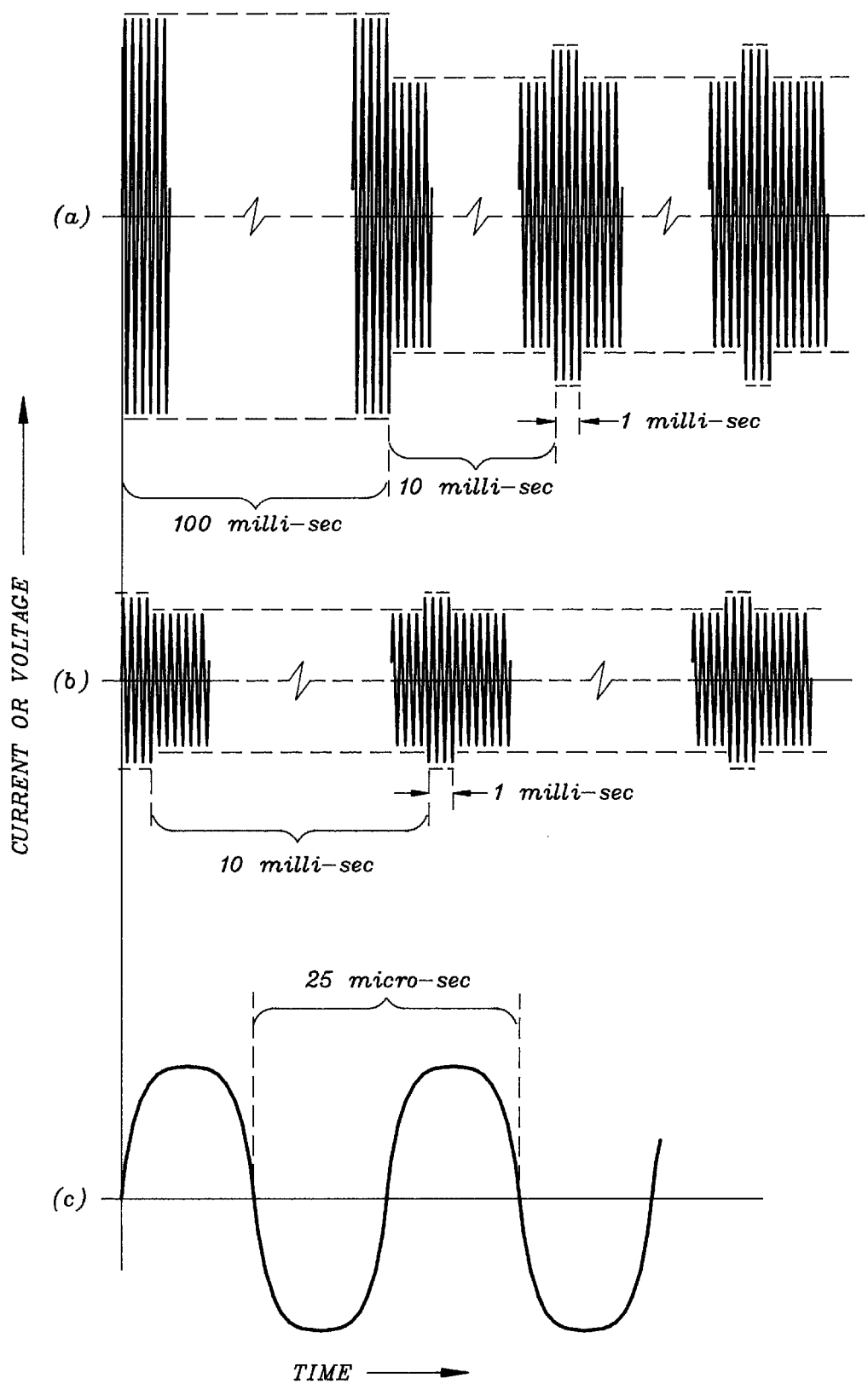
FIG. 21 illustrates various voltage and current waveforms typical of the circuit arrangement of FIG. 19.

FIG. 21 shows various voltage and current waveforms characteristic of the operation of the circuit arrangements of FIGS. 19 and 20.

Waveform (a) of FIG. 21 shows, as a function of time, amplitude variations and modulations on the AC voltage present between the B– bus and output bus OB.

Waveform (b) of FIG. 21 shows, as a function of time (with fluorescent lamp QFL1 connected and properly functioning), amplitude modulations on the alternating current flowing between lamp socket terminals LST1a and LST1b, which is to say: through lamp QFL1.

Waveform (c) of FIG. 21 shows the waveform of each individual cycle of the alternating current flowing through lamp QFL1.

Details of Operation of Preferred Embodiments

The detailed operation of the circuit arrangement of FIG. 19 is explained as follows.

In FIG. 19, pre-converter circuit PCC' functions in the same manner as does pre-converter circuit PCC of FIG. 13, thereby providing between the B– bus and the B+ bus a DC supply voltage of substantially constant magnitude; the particular level of which substantially constant magnitude can be adjusted over a significant range by providing more or less of a unidirectional control current to control input terminal CIT3.

In its basic operation, the half-bridge inverter circuit of FIG. 19 functions like the half-bridge inverter circuit of FIG. 17; the main difference being that the circuit arrangement of FIG. 19 only controls the magnitude of the AC voltage across the tank capacitor (QTC) of the series L-C circuit (i.e., QTI as series-connected with QTC) rather than both the magnitude of the AC voltage as well as that of the lamp current.

Thus, via the voltage-dividing network consisting of elements QR3, QC3, QR4 and QC4, a relatively low-magnitude AC voltage of magnitude proportional to that of the relatively high-magnitude AC voltage present at output bus OB (i.e., the AC bus voltage) is rectified, filtered and presented to control input terminal QIT1b of integrated circuit means QIC1, thereby to control the duration of the ON-time of transistor QF1 such as to maintain the magnitude of the AC bus voltage at a desired substantially constant level.

Thus, absent any control input current provided via resistor QR6, the amplitude of the AC bus voltage is maintained at a substantially constant level by way of a negative feedback circuit operative to cause the ON-time of transistor QF1 to shorten in proportion to the amount by which the amplitude of the AC bus voltage exceeds a certain pre-set level; which pre-set level can be set and/or adjusted by way of setting and/or adjusting the magnitude of the current provided to control input terminal QIT1b through resistor QR6.

That is, the magnitude of the control output voltage provided at control output terminal QCOT3a determines the level at which the amplitude of the AC bus voltage is maintained substantially constant; which, for instance, means that the amplitude of the AC bus voltage is controllable by actions from integrated circuit means QIC3.

Also, by way of input to control input terminal CIT3 of Controller Means CM, the magnitude of the DC supply voltage provided between the B– bus and the B+ bus is adjustable by action delivered (via resistor R6) from control output terminal QOT3b of integrated circuit means QIC3.

In particular, {with reference to waveform (a) of FIG. 21}, on power-up, integrated circuit means QIC3 functions such as to provide a control output voltage at terminal QOT3a that results in the amplitude of the 30–40 kHz AC bus voltage being such as to have an RMS magnitude of about 600 Volt for a duration of about 100 milli-seconds. Thereafter, the control output voltage is modified so as to cause the RMS magnitude of the AC bus voltage to be maintained at about 400 Volt, except for being pulsed once every 10 milli-seconds to an RMS magnitude of about 500 Volt; each pulse having a duration of about 1.0 milli-second.

Each of instant-start fluorescent lamps QFL1, QFL2 and QFL3 is connected between the B– bus and output bus OB by way of a ballast reactance means (e.g., BRM1); which ballasting reactance means may be either a capacitor, an inductor, or a combination of a capacitor and an inductor. In an actual operating prototype circuit, each ballast reactance means was chosen to be a capacitor.

With each ballast reactor means (e.g., BRM1) being a capacitor, the inverter's frequency of oscillation decreases with the number of lamps connected; which implies that—for a ballast capacitor of a given capacitance value and for an AC bus voltage of a given magnitude—the magnitude of the lamp current in each lamp will decrease with increasing number of lamps connected.

To prevent the magnitude of the lamp current of a given lamp from changing as a function of the number of lamps connected and/or powered, arrangements are made by which the magnitude of the AC bus voltage is made to be inversely proportional to its frequency. In particular, the voltage divider consisting of elements QR3, QC3, QR4 and QC4 is made such as to have a division factor that decreases with decreasing frequency (which would result if, for instance, capacitor QC4 were to be eliminated). Thus, as the inverter's oscillating frequency decreases due to an increasing number of lamps connected and powered (which, in effect, results in an increase in the capacitance value of the tank capacitor resonating with tank inductor QIT), the magnitude of the AC bus voltage increases in proportion to the decrease in its frequency, thereby keeping the magnitude of the current in each lamp substantially constant irrespective of the number of lamps connected and powered.

The circuit arrangement of FIG. 20 operates in substantially the same manner as that of FIG. 19, except that control of the amplitude of the AC bus voltage is effected by controlling the fundamental frequency of the inverter's squarewave output voltage instead of the symmetry of the inverter's squarewave output voltage (as is done in the arrangement of FIG. 19).

Thus, in the circuit arrangement of FIG. 20, the power-up lamp ignition scenario is the same as that of the circuit arrangement of FIG. 19; which lamp ignition scenario is illustrated by waveform (a) of FIG. 21. That is, in both FIG. 19 and FIG. 20, on power-up, each lamp is subjected to an ignition voltage of particularly high magnitude (e.g., 600 Volt), thereby ensuring particularly effective lamp ignition. About 100 milli-seconds after power-up, all functional lamps will have fully ignited; whereafter the RMS magnitude of the AC bus voltage is reduced to 400 Volt, except for being pulsed every 10 milli-seconds to about 500 Volt.

The purpose of the pulsing is that of causing a lamp to be initially ignited at times other than on power-up; which feature is important for convenient lamp replacement. However, when inserted into its socket more than 100 milli-seconds after initial power-up, while it will indeed ignite, a lamp will ignite in a less desirable manner; which is acceptable for the few times a lamp needs to be replaced. Had the pulsing not been provided, however, lamp ignition might not occur at all except on initial power-up; which implies that, upon relamping, the power line voltage provided to the ballast would have had to be interrupted for a brief period in order to ignite the lamps.

The purpose of reducing the amplitude of the AC bus voltage after initial lamp ignition is that of providing for improved energy efficiency and lower ballast cost. An AC bus voltage of 600 Volt RMS magnitude requires a current of 50% larger magnitude versus what is required with an AC bus voltage of 400 Volt RMS magnitude. Thus, concomitant losses in circuit components carrying this current (i.e., the transistors, the tank inductor and the tank capacitor) will be about 2.25 (i.e., 1.5 squared) times larger at the 600 Volt RMS magnitude versus the 400 Volt RMS magnitude.

Additional Comments Regarding the Preferred Embodiments (ba) In the circuit arrangement of FIG. 19, the drive voltage provided to the gate of transistor QF2 is derived from an AC voltage provided from auxiliary winding QAW on tank inductor QTI. This AC voltage (whose instantaneous magnitude is directly proportional to the slope of the instantaneous magnitude of the current flowing through tank inductor QTI) is "integrated" by way of resistor QR2 and capacitor QC2a, thereby providing at control input terminal QIT2 a substantially sinusoidal voltage of phase slightly leading the phase of the current flowing through tank inductor QTI.

The substantially sinusoidal voltage provided to control input terminal QIT2 of integrated circuit means QIC2 results in a squarewave voltage being provided from control output terminal QOT2. The cross-over points of this squarewave voltage are substantially the same as those of the substantially sinusoidal voltage provided to control input terminals QIT2.

(bb) Inductors may advantageously be used as ballast reactance means BRM1, BRM2, BRM3.

In particular, if using inductors as ballast reactance means, the size and current-handling rating of tank inductor QTI may be reduced.

Then, in the arrangement of FIG. 19, as more lamps are inserted, the natural resonance frequency of the L-C series-resonant circuit increases; which, in turn, means that the inverter's oscillating frequency will increase with increasing number of connected/powered lamps. Thus, to maintain the same magnitude lamp current regardless of the number of lamps connected and powered, the amplitude of the AC bus voltage has to be increased/decreased in proportion with frequency.

The use of inductors instead of capacitors as ballast reactance means results in a significant improvement in the power factor associated with the inverter's output current as delivered to center bus CB from the junction of the drain and the source of transistors QF1 and QF2, respectively. As a result, a given amount of net lamp power results at a lower level of output current than otherwise would be the case.

(bc) The circuit arrangement of FIGS. 19 and 20 are intended to power any number up to four 48"/T-8 instant-start fluorescent lamps, such as Sylvania Octron lamps.

An important characteristics of such instant-start lamps is the ratio between the RMS magnitude of the voltage required to effect proper lamp ignition versus the RMS magnitude of the voltage across the lamp after ignition has occurred. For some instant-start lamps of the indicated type, the RMS magnitude required for proper lamp ignition is as high as 600 Volt. (Actually, most such lamps will ignite—albeit not necessarily in a desirable manner—at an RMS voltage of 500 Volt.) However, after ignition is fully completed, the RMS voltage across the lamp will be only about 140 Volt at a nominal lamp current magnitude of about 0.2 Ampere RMS (i.e., 28 Watt).

If powering a lamp-ballast combination (e.g., BRM1 and QFL1) from an AC bus voltage of RMS magnitude several times larger than the lamp operating voltage, the ballasting reactor means has to handle a Volt-Ampere product substantially equal to the RMS magnitude of the lamp current multiplied with the RMS magnitude of the AC bus voltage.

In particular and by way of example, when powering a lamp-ballast combination such as described above from an AC bus voltage of RMS magnitude sufficiently large for proper lamp ignition (i.e., 600 Volt), the ballast reactance means has to handle a Volt-Ampere product equal to about 120 Volt-Ampere (i.e., 600×0.2 Volt-Ampere). However, with the feature of reducing the RMS magnitude of the AC bus voltage to (say) about 400 Volt after lamp ignition, the Volt-Ampere product that must be handled on a continuous basis by the ballasting reactor means is reduced from 120 to 80 Volt-Ampere.

For a ballasting reactor means of a given size and rating, the real power losses associated with handling 80 Volt-Ampere of "reactive power" versus handling 120 Volt-Ampere of "reactive power" is reduced by a factor of 120/80 squared; which is to say: by a factor of about 2.25.

For still higher efficiency gains, the RMS magnitude of the AC bus voltage can be reduced even further after lamp ignition. However, if necessary not to exceed a lamp current crest factor of 1.70, reduction much below 400 Volt will not provide for reliable lamp starting, except by re-initiating the initial 100 milli-second-long lamp ignition cycle provided only on power-up.

(bd) Basically, any of the half-bridge inverter circuits of FIGS. 14, 17, 19 and 20 can be used for providing a magnitude-regulated AC voltage to a bus required to power one, two or more parallel-connected lamp-ballast combinations.

(be) The waveforms of FIG. 18 pertain as well to the circuit arrangement of FIG. 19. Waveforms (a) correspond to the unloaded condition; while waveforms (d) correspond to a fully loaded condition.

(bf) Usually, 1.70 is the maximum permissible lamp current crest factor for the type of instant-start fluorescent lamps described above.

Waveform (c) of FIG. 21, which represents the lamp current during the periods when the AC bus voltage has an RMS magnitude of 400 Volt, indicates a lamp current crest factor of about 1.25 (which, incidentally, is significantly lower than the crest factor of 1.4 associated with a sinusoidal waveform).

The value of the crest factor of each individual cycle of the high-frequency (i.e., 30–40 kHz) lamp current determines the permissible maximum magnitude of the 1.0 milli-seconds-long lamp pulses of AC bus voltage illustrated in waveforms (a) and (b) of FIG. 21. In particular and by way of example, with a basic per-individual-cycle lamp current crest factor of 1.25 and with a maximum permissible lamp current crest factor of 1.7, the permissible maximum magnitude of the 1.0 milli-seconds-long pulses of AC bus voltage is 1.36 (i.e., 1.70 divided by 1.25) times larger than the magnitude of the AC bus voltage during the period between pulses.

Thus, with the between-pulses RMS magnitude of the AC bus voltage being 400 Volt, the RMS magnitude of the pulses may be as high as 544 Volt. Conversely, with the pulses having an RMS magnitude of 500 Volt, the RMS magnitude of the AC bus voltage between pulses can be as low as 368 Volt.

(bg) The 1.0 milli-seconds-long pulses of AC bus voltage is indicated as having a cycle period of 11.0 milli-second, which corresponds to a repetition frequency of about 91 Hz. However, there is nothing particularly significant about 91 Hz. The only requirement is that the pulse repetition rate be high enough to prevent visible flicker in the light output from the lamps.

One arrangement that is particularly appropos is that of providing these 1.0 milli-seconds-long pulses at a repetition frequency of 120 Hz; in which case a signal for initiating the pulses can be derived from the full-wave-rectified power line voltage.

Also, it i noted that there is nothing particularly significant with having a pulse duration of exactly 1.0 milli-second. However, based on experimental results, it should have a duration of least 0.25 milli-seconds; which represents the time it takes for the gas in a fluorescent lamp to ionize after having been subjected to a voltage of magnitude sufficient to cause such ionization.

(bh) If using inductors as ballasting reactance means in the several lamp-ballast combinations, to attain proper regulation of lamp current magnitude versus number of lamps connected and powered, it is necessary to cause the RMS magnitude of the AC bus voltage to increase with frequency; which, for instance, can be attained by removing capacitor QC3 from the voltage-dividing network otherwise consisting of elements QR3, QR4 and QC4.

(bi) Integrated circuit means QIC1 includes a so-called "one-shot" and operates in such manner as to cause—each time the magnitude of the voltage at control input terminal QIT1$a$ is pulled to zero (which happens each time the magnitude of the voltage at the drain of transistor QF1 falls to zero; which, as may be seen from waveforms (a) and (d) of FIG. 18, occurs each time right after transistor QF2 is turned OFF)—the magnitude of the control output voltage provided at its control output terminal QOT1 to go to a level high enough to cause transistor QF1 to be switched into its conductive state (i.e., into its ON-state). Then, in line with its "one-shot" feature, each time after such control output voltage is provided, a timing cycle starts, eventually—after a controllable duration to cause the magnitude of the control output voltage to fall to zero.

Of course, the control of this controllable duration is effected by the magnitude of the signal provided at control input terminal QIT1$b$.

(bj) With reference to FIGS. 19 and 20, it is noted that the magnitude of the DC supply voltage provided between the B– bus and the B+ bus is automatically regulated; which means that, if the magnitude of the power line voltage were to change by a certain percentage, the magnitude of the DC supply voltage would change by a much lower percentage. It is also noted that the magnitude of the AC bus voltage is automatically regulated as well; which means that if the magnitude of the DC supply voltage were to change by a given percentage, the magnitude of the AC bus voltage would change by a much smaller percentage.

Thus, the magnitude of the AC bus voltage is actually doubly regulated, thereby providing for an exceedingly high degree of automatic regulation with respect to changes in lamp light output versus changes in the magnitude of the power line voltage.

(bk) The inverter circuit of FIG. 19 is self-oscillating and—just like the inverter circuit of FIG. 13—must be triggered into oscillation.

Once triggered into oscillation, the output from tertiary winding QTW is operative to cause a low-magnitude (e.g., 10–20 Volt) DC voltage to be applied to the AA+ terminal of integrated circuit means QIC3.

It is emphasized that this low-magnitude DC voltage as also intended to be applied to terminal A+ of Controller Means CM as well as to terminal A'+ of integrated circuit means QIC1.

One useful consequence of using the output from the inverter for powering the pre-converter's Controller Means is that it provides for a more expedient start-up of the pre-converter compared with the conventional boot-strap way of starting the pre-converter.

It is noted that—directly from the power line and through bridge rectifier BR, inductor ESI and rectifier HSR—a DC supply voltage will be provided between the B– bus and the B+ bus prior to the pre-converter having started operation.

Not shown is another winding on the tank inductor; which other winding is combined with a rectifier and a filter means, thereby to provide a "floating" low-magnitude (e.g., 10–20 Volt) DC voltage between the A"– terminal and the A"+ terminal of integrated circuit means QIC2.

(bl) In the circuit arrangement of FIG. 19, the inverter output voltage present between center bus CB and (say) the B– bus—when stripped of any DC component—is a squarewave voltage with controllable symmetry.

According to the IEEE Standard Dictionary of Electrical and Electronics Terms, a squarewave is "a periodic wave that alternately for equal lengths of time assumes one of two fixed values, the time of transition being negligible in comparison".

As used herein, a squarewave voltage is: a periodic voltage wave that alternately for equal or unequal lengths of time assumes one of two fixed voltage levels, the time of transition between levels being negligible in comparison.

Thus, a non-symmetrical squarewave voltage is a sqaurewave voltage that remains at the one fixed voltage level for a longer period than it remains at the other fixed voltage level.

Waveform (a) of FIG. 18 is illustrative of a nonsymmetrical squarewave voltage.

In waveform (a), it is noted that the little voltage steps occuring at the dashed lines are of magnitude negligible in comparison with the peak-to-peak magnitude; which peak-to-peak magnitude—in a half-bridge inverter circuit such as that of FIG. 19—is equal to the magnitude of the DC supply voltage.

(bm) With reference to waveforms (a) and (d) of FIG. 18, it is emphasized that as the squarewave voltage gets more symmetrical, its frequency increases.

Thus, with reference to the circuit arrangement of FIG. 19, as the output—which is provided between output bus OB and the B– bus—is increasingly loaded, the inverter output voltage gets increasingly symmetrical and the frequency increases an a corresponding manner.

The above-identified effect is also a feature of the inverter circuit arrangement of FIG. 2 as modified in accordance with FIG. 6; wherein, when load 26" is removed, the magnitude of the voltage across tank inductor 52" increases (due to the increased Q-factor); which increased voltage magnitude causes the magnitude of the current flowing through the TOROID HEATER to increase; which increased current magnitude, in turn, causes the TOROID HEATER to increase its temperature; thereby to cause the ferrite of saturable current transformers 47 and 49 to be additionally heated; thereby, in turn, to cause the ON-time of transistors 42, 43 to decrease; thereby to cause the inverter frequency to increase; etc.

In other words, with continued reference to the inverter circuit of FIG. 2, due to the basic fact that the Q-factor of an L-C circuit increases with decreasing loading, the magnitude of the output voltage provided across the output terminals (i.e., the terminals across which load 26" is connected) is higher when the load is not connected than it is when the load is connected. Or, conversely, the loading caused by connecting load 26" across the output terminals causes the inverter's oscillating frequency to decrease.

Also, when the load is non-connected (or of such nature as to draw only a very small amount of power), the action of the TOROID HEATER—in causing the inverter frequency to increase with increasing magnitude of output voltage—causes the magnitude of the output voltage to be self-limiting; which is to say that the magnitude of the output voltage provided across the output terminals is prevented from exceeding a pre-established level as a result of negative feedback operative to cause the inverter frequency to increase with increasing output voltage magnitude, thereby to cause the inverter frequency to be tuned further away from the natural resonance frequency of the L-C circuit; thereby, in turn, causing a reduction in output voltage magnitude in comparison with what it would have been without this negative feedback.

What is claimed is:

1. An arrangement comprising:
    a source providing a DC supply voltage across a pair of DC terminals;
    an inverter circuit connected with the DC terminals and operative to provide an alternating inverter output voltage across a pair of inverter output terminals; the inverter circuit having a frequency-controlling means functional, on receipt of a frequency-controlling action, to control the frequency of the inverter output voltage;
    an L-C series-circuit connected across the inverter output terminals; the L-C series-circuit having: (i) a tank inductor connected in series with a tank capacitor; and (ii) a natural resonance frequency at or near the frequency of the inverter output voltage, such that an AC output voltage is developed across the tank capacitor;
    a first entity disposed in communication with the tank capacitor and functional to provide a first output indicative of the magnitude of the AC output voltage; the first output being provided to the frequency-controlling means in such manner as to constitute delivery of said frequency-controlling action; thereby, in turn, to cause the magnitude of the AC output voltage to be maintained at a predetermined level substantially regardless of the magnitude of any current flowing into a loading means connected across the tank capacitor; and
    gas discharge lamp means connected in circuit across the tank capacitor, thereby to constitute said loading means; the gas discharge lamp means being functional to be properly powered from the AC output voltage.

2. The arrangement of claim 1 wherein: (i) the inverter output voltage is a squarewave voltage; and (ii) the frequency-controlling action is functional to control, not only the frequency of this squarewave voltage, but also the symmetry thereof.

3. The arrangement of claim 1 wherein the gas discharge lamp means includes at least two lamp-ballast series-combinations; each such series-combination: (i) having a ballast reactor connected in series with a gas discharge lamp; and (ii) being connected across the tank capacitor.

4. The arrangement of claim 1 wherein the inverter circuit includes an adjustment input functional, on receipt of an adjustment input signal, to adjust the predetermined level.

5. The arrangement of claim 4 wherein:
    (i) the frequency of the AC output voltage is very much higher than the frequency of the power line voltage of an ordinary electric utility power line; and
    (ii) an auxiliary control signal is additionally provided to the inverter's adjustment input, thereby to cause the predetermined level periodically to vary, at a frequency much lower than the frequency of the AC output voltage, between a first relatively low level and a second relatively high level; thereby, in turn, to cause the magnitude of the AC output voltage to be amplitude-modulated in a periodic manner.

6. The arrangement of claim 4 including timing means connected with the inverter's adjustment input and operative, when initially the DC supply voltage is being provided across the DC terminals, to cause the magnitude of the AC output voltage to be substantially higher than said predetermined level for a brief period of time.

7. The arrangement of claim 6 wherein the brief period of time in on the order of one second or less.

8. The arrangement of claim 1 including a sub-circuit connected with the inverter's control input and operative under certain circumstances to cause the magnitude of the AC output voltage to be substantially higher than said predetermined level for a brief period of time.

9. The arrangement of claim 1 including a sub-assembly of components connected with the inverter's control input and operative to cause the predetermined level periodically to vary between a first relatively low level and a second relatively high level, thereby to cause the magnitude of the AC output voltage to be periodically amplitude-modulated.

10. The arrangement of claim 1 wherein said source: (i) is connected with the AC power line voltage of an ordinary electric utility power line; and (ii) includes means functional to cause the magnitude of the DC supply voltage to be substantially higher than the peak magnitude of the AC power line voltage.

11. The arrangement of claim 10 wherein the source includes a regulation circuit functional to regulate the magnitude of the DC supply voltage in such manner as to maintain it at a substantially constant level irrespective of significant variations in the magnitude of the AC power line voltage.

12. The arrangement of claim 1 wherein: (i) the peak-to-peak magnitude of the inverter output voltage is substantially equal to the magnitude of the DC supply voltage; and (ii) the control input is, on receipt of said control input signal, additionally functional to control the waveform of the inverter output voltage.

13. The arrangement of claim 12 wherein: (i) the inverter output voltage is a squarewave voltage; and (ii) the control input is, on receipt of said control input signal, additionally functional to control the symmetry of the squarewave voltage.

14. An arrangement comprising:

a source providing a DC supply voltage across a pair of DC terminals;

an inverter circuit connected with the DC terminals and operative to provide an alternating inverter output voltage across a pair of inverter output terminals; the inverter output voltage being a squarewave voltage in the sense of having an instantaneous magnitude alternating periodically between being of a first substantially constant negative magnitude and being of a second substantially constant positive magnitude, spending substantially no time being of zero magnitude; the inverter circuit having a waveshape-controlling means functional, on receipt of a waveshape-controlling action, to control the symmetry of the squarewave voltage in the sense of controlling the duration of time the instantaneous magnitude of the inverter output voltage is of said first substantially constant negative magnitude versus the duration of time it is of said second substantially constant positive magnitude;

an L-C series-circuit connected across the inverter output terminals; the L-C series-circuit having: (i) a tank inductor connected in series with a tank capacitor; and (ii) a natural resonance frequency at or near the frequency of the inverter output voltage, such that an AC output voltage is developed across the tank capacitor;

a sub-circuit connected with the L-C series-circuit and functional to provide a sub-circuit output indicative of the magnitude of the AC output voltage; the sub-circuit output being provided to the waveshape-controlling means in such manner as to constitute said waveshape-controlling action; thereby, in turn, to cause the magnitude of the AC output voltage to be maintained at a predetermined level; and gas discharge lamp means disconnectably connected in parallel with the tank capacitor.

15. An arrangement comprising:

a source providing a DC supply voltage across a pair of DC terminals;

an inverter circuit connected with the DC terminals and operative to provide an alternating inverter output voltage across a pair of inverter output terminals; the inverter circuit having a frequency-controlling means functional, on receipt of a frequency-controlling action, to control the frequency of the inverter output voltage;

an L-C circuit connected with the inverter output terminals; the L-C circuit having: (i) a tank inductor connected with a tank capacitor; (ii) a natural resonance frequency at or near the frequency of the inverter output voltage; and (iii) an AC output voltage present across the tank capacitor;

a second entity disposed in connective relationship with the L-C circuit and functional to provide a second output indicative of the magnitude as well as the frequency of the AC output voltage; the second output being communicated to the frequency-controlling means in such manner as to result in the provision of said frequency-controlling action, thereby to cause the magnitude of the AC output voltage to be maintained at a certain level; the certain level being a function of the frequency of the AC output voltage; and a number of lamp-ballast series-combinations; each such series-combination: (i) being parallel-connected with the tank capacitor, thereby to cause a lamp-ballast current to flow through it; (ii) having a ballast reactor connected in series with a gas discharge lamp; and (iii) causing, when being connected across the tank capacitor, the frequency of the AC output voltage to change by a certain amount;

the arrangement being functional to cause said certain level to be adjusted in such manner that the magnitude of the lamp-ballast current be maintained at substantially the same level regardless of the particular number of lamp-ballast series-combinations connected in parallel with the tank capacitor;

whereby, if one lamp-ballast series-combination be added to said number of lamp-ballast series-combinations, the magnitude of the current flowing through each gas discharge lamp remains the same.

16. The arrangement of claim 15 wherein: (i) the tank capacitor and the tank inductor are connected in series to form a series L-C circuit; and (ii) the series L-C circuit is connected across the inverter output terminals.

17. An arrangement comprising:

a source providing a constant-magnitude DC supply voltage across a pair of DC terminals;

an inverter circuit connected with the DC terminals and operative to provide an AC ballast voltage across a pair of ballast output terminals; the AC ballast voltage being amplitude-modulated at a frequency substantially lower than the frequency of the AC ballast voltage; and a gas discharge lamp connected with the ballast output terminals and functional to draw a lamp current therefrom; the lamp current being amplitude-modulated in synchronism with the amplitude-modulation of the AC ballast voltage.

18. An arrangement comprising:

a source providing a constant-magnitude DC supply voltage across a pair of DC terminals;

an inverter circuit connected with the DC terminals and operative to provide an AC bus voltage across a pair of bus terminals; the AC bus voltage being amplitude-modulated at a frequency substantially lower than the frequency of the AC bus voltage; and each of a number of lamp-ballast series-combinations being connected across the bus terminals; each lamp-ballast series-combination being operative to cause a lamp current to flow therethrough; the lamp current being amplitude-modulated in synchronism with the amplitude-modulated AC bus voltage.

19. An arrangement comprising:

a source starting at some given point in time to provide a substantially constant-magnitude DC supply voltage across a pair of DC terminals;

an inverter circuit connected with the DC terminals and operative to provide an AC bus voltage across a pair of bus terminals; for a brief period starting at said given point in time, the AC bus voltage being of a first relatively high magnitude; after the brief period, the AC bus voltage being of a second relatively low magnitude; and each of a number of lamp-ballast series-combinations being connected across the bus terminals; each lamp-ballast series-combination including a gas discharge lamp and being operative to draw a lamp current from the bus terminals.

20. The arrangement of claim 19 wherein the gas discharge lamp is an instant-start fluorescent lamp.

21. The arrangement of claim 19 wherein the duration of the brief period is on the order of 100 milli-seconds.

22. The arrangement of claim 19 wherein the inverter-type circuit is characterized by: (i) including an inverter functional to provide a squarewave inverter voltage across a pair of inverter terminals; and (ii) having a series-combination of a tank inductor and a tank capacitor, this series-combination being connected across the inverter terminals.

23. An arrangement comprising:
a source providing a substantially constant-magnitude DC supply voltage across a pair of DC terminals;
an inverter circuit connected with the DC terminals and operative to provide an AC bus voltage across a pair of bus terminals; the AC bus voltage being amplitude-modulated at a frequency substantially lower than the frequency of the AC bus voltage; and
a lamp-ballast series-combination being connected across the bus terminals; each lamp-ballast series-combination including a gas discharge lamp and being operative to draw a lamp current from the bus terminals;
whereby the lamp current is amplitude-modulated at a frequency substantially lower than the frequency of the AC bus voltage while the magnitude of the DC supply voltage remains constant.

24. An arrangement comprising:
a source providing a DC supply voltage across a pair of DC terminals;
an inverter circuit connected with the DC terminals and operative to provide an AC voltage across a pair of ballast terminals; the inverter circuit including control means operative to control the frequency of the AC voltage in response to the loading presented to the ballast terminals; the frequency of the AC voltage being relatively high when there is no loading and relatively low when there is substantial loading; and
a gas discharge lamp disconnectably connected across the ballast terminals, thereby to draw a lamp current therefrom when so connected;
such that, whenever the lamp is indeed connected with and drawing current from the ballast terminals, the frequency of the AC voltage is relatively low; whereas, whenever the lamp is not so connected, the frequency of the AC voltage is relatively high.

25. The arrangement of claim 24 wherein the peak magnitude of the AC voltage is relatively low when the lamp is indeed drawing current from the ballast terminals and relatively high when no lamp current is drawn from the ballast terminals.

26. The arrangement of claim 24 wherein, whenever the lamp is being connected with the ballast terminals, the magnitude and the frequency of the AC voltage are relatively high just prior to lamp ignition and relatively low after lamp ignition.

27. The arrangement of claim 24 wherein the electronic ballast circuit is further characterized by including an L-C series-circuit having a natural resonance frequency at or near the frequency of the AC voltage.

28. An arrangement comprising:
a source providing a DC supply voltage across a pair of DC terminals;
an inverter circuit connected with the DC terminals and operative to provide an AC voltage across a pair of ballast terminals; the inverter circuit including control means operative to control the frequency of the AC voltage in response to the magnitude of the AC voltage; the frequency of the AC voltage being relatively high when the magnitude of the AC voltage is relatively high and relatively low when the magnitude of the AC voltage is relatively low; and
a gas discharge lamp disconnectably connected across the ballast terminals, thereby to cause the magnitude of the AC voltage to be: (i) relatively low when the lamp is indeed so connected and when drawing a lamp current; and (ii) relatively high when the lamp is not so connected.

29. The arrangement of claim 28 wherein, whenever the lamp is being connected with the ballast terminals, the magnitude and the frequency of the AC voltage are relatively high just prior to lamp ignition and relatively low after lamp ignition.

30. The arrangement of claim 28 wherein, whenever the lamp is being disconnected with the ballast terminals, the magnitude and the frequency of the AC voltage are relatively low just prior to disconnection and relatively high after disconnection.

31. An arrangement comprising:
a source providing a DC supply voltage across a pair of DC terminals;
an inverter circuit assembly connected with the DC terminals and operative to provide an alternating inverter output voltage across a pair of inverter output terminals; the inverter circuit having a frequency-controlling sub-assembly functional, on receipt of a frequency-controlling action, to control the frequency of the inverter output voltage;
an L-C series-circuit effectively connected across the inverter output terminals; the L-C series-circuit having: (i) a tank inductor connected in series with a tank capacitor; and (ii) a natural resonance frequency at or near the frequency of the inverter output voltage, such that an AC output voltage is developed across the tank capacitor;
an action-causing entity disposed in connective relationship with the tank capacitor and operative to provide an action output indicative of the magnitude of the AC output voltage; the action output being provided to the frequency-controlling sub-assembly in such manner as to constitute delivery of said frequency-controlling action, thereby to cause the magnitude of the AC output voltage to be lower than it would have been in the absence of so providing said frequency-controlling action; and
loading circuit connected across the tank capacitor; the loading circuit being characterized by including a gas discharge lamp.

32. An arrangement comprising:
a source providing a DC supply voltage across a pair of DC terminals;
an inverter circuit assembly connected with the DC terminals and operative to provide an alternating inverter output voltage across a pair of inverter output terminals; the inverter circuit including a frequency-controlling sub-assembly functional, on receipt of a frequency-controlling action, to control the frequency of the inverter output voltage;

an L-C series-circuit effectively connected across the inverter output terminals; the L-C series-circuit: (i) having a tank inductor connected in series with a tank capacitor; (ii) having a natural resonance frequency at or near the frequency of the inverter output voltage, such that an AC output voltage is developed across the tank capacitor; and (iii) being characterized by causing the magnitude of the AC output voltage to become unacceptably high except if either a loading means be connected in circuit with the L-C circuit, or said frequency-controlling action be supplied to the control input;

an action-causing entity connected with the L-C circuit and operative to provide an action output indicative of the magnitude of the AC output voltage; the action output being provided to the frequency-controlling sub-assembly in such manner as to constitute delivery of said frequency-controlling action; thereby, even in the absence of said loading means, to cause the magnitude of the AC output voltage to be lower than it would have been in the absence of supplying said frequency-controlling action; and loading circuit connected across the tank capacitor, thereby to constitute said loading means at least some of the time; the loading circuit being characterized by including a gas discharge lamp.

* * * * *